(12) United States Patent
Ishiyama

(10) Patent No.: US 7,250,686 B2
(45) Date of Patent: Jul. 31, 2007

(54) SEMICONDUCTOR DEVICE, METHOD FOR DESIGNING THE SAME AND RECORDING MEDIUM THAT CAN BE READ BY COMPUTER IN WHICH PROGRAM FOR DESIGNING SEMICONDUCTOR DEVICE IS RECORDED

(75) Inventor: Yasuhiro Ishiyama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/412,749

(22) Filed: Apr. 28, 2006

(65) Prior Publication Data

US 2006/0197212 A1   Sep. 7, 2006

Related U.S. Application Data

(62) Division of application No. 10/369,718, filed on Feb. 21, 2003, now abandoned.

(30) Foreign Application Priority Data

Feb. 21, 2002   (JP) .............................. 2002-044756

(51) Int. Cl.
*H01L 23/49* (2006.01)
(52) U.S. Cl. ..................... 257/784; 257/686; 257/777; 257/E23.024; 257/E23.025
(58) Field of Classification Search ................ 257/686, 257/777, 784, E23.024, E23.025
See application file for complete search history.

(56) References Cited

U.S. PATENT DOCUMENTS 5,113,239 A * 5/1992 Cini et al. .................. 257/779
5,173,762 A * 12/1992 Ota ............................ 257/666
5,422,435 A    6/1995 Takiar et al.
5,530,284 A * 6/1996 Bailey ........................ 257/670
6,215,182 B1 * 4/2001 Ozawa et al. ............... 257/723
6,316,838 B1 * 11/2001 Ozawa et al. ............... 257/778
6,677,672 B2 * 1/2004 Knapp et al. ............... 257/687
6,731,011 B2 * 5/2004 Verma et al. ............... 257/777
6,812,580 B1 * 11/2004 Wenzel et al. .............. 257/784
6,882,056 B2 * 4/2005 Komiyama et al. ......... 257/777
2002/0047213 A1   4/2002 Komiyama et al.
2005/0093167 A1 * 5/2005 Saeki ......................... 257/774

FOREIGN PATENT DOCUMENTS

JP         11-54693        2/1999

* cited by examiner

*Primary Examiner*—Evan Pert
*Assistant Examiner*—Victor A. Mandala, Jr.
(74) *Attorney, Agent, or Firm*—McDermott Will & Emery LLP

(57) ABSTRACT

A semiconductor device of the present invention comprises a first semiconductor chip that includes a first internal circuit and at least one first conductive pad which is provided on its upper surface and is not connected to the first internal circuit, a second semiconductor chip provided on the first semiconductor chip that includes a second internal circuit and at least one second conductive pad which is provided on its upper surface and is connected to the second internal circuit, at least one first connecting member for connecting between the second semiconductor chip provided on the first semiconductor chip, at least one first conductive pad and at least one second conductive pad, and at least one second connecting member led from at least one first conductive.

3 Claims, 28 Drawing Sheets

SEMICONDUCTOR DEVICE, METHOD FOR DESIGNING THE SAME AND RECORDING MEDIUM THAT CAN BE READ BY COMPUTER IN WHICH PROGRAM FOR DESIGNING SEMICONDUCTOR DEVICE IS RECORDED

RELATED APPLICATIONS

This application is a divisional of Application 10/369,718, filed Feb. 21, 2003, now abandoned which claims priority of Japanese Application No. 2002-044756, filed Feb. 21, 2002, the contents of which are hereby incorporated by reference.

BACKGROUND OF THE INVENTION

The present invention relates to a semiconductor device that a plurality of semiconductor chips are integrally structured and in particular to, facilitation of design for the semiconductor device.

A semiconductor device with a plurality of semiconductor chips being integrally structured therein is conventionally designed so that pads for the semiconductor chips are connected together by utilizing wire bonding connection or flip chip connection.

A conventional semiconductor device with a plurality of semiconductor chips being integrally structured therein will be described hereinafter.

FIG. 27 is a view showing the structure of a conventional semiconductor device with a plurality of semiconductor chips being integrally structured therein. FIG. 28 is a cross-sectional view taken along a line X-X shown in FIG. 27.

As shown in FIGS. 27 and 28, a semiconductor device 1000 comprises a semiconductor chip B, a semiconductor chip A which is adhered on the semiconductor chip B with an adhered portion being interposed therebetween and wires 11, 12, 13, 14, 15, 16, 21, 22, 23, 24, 25 and 26 extended from pads for the semiconductor chips A and B by wire bonding.

The wires 13, 15, 23 and 25 connect the pads for the chip A to the pad for the chip B. The wires 12, 14, 22 and 24 connect the pads for the chip A to electrodes outside the semiconductor device 1000 (e.g., lead frame, electrode pad for printed wiring board and the like). The wires 11, 16, 21 and 26 connect the pad for the chip B to external of the semiconductor device 1000.

There arise following various problems in designing and manufacturing the conventional semiconductor device 1000.

Firstly, as shown in FIG. 28, in accordance with the conventional semiconductor device 1000, a maximum distance h from the wire 12 or 22 to the upper surface of the semiconductor chip B is extremely long. Further, portions of the wires 12 and 22 that are not connected to pads are long. For this reason, the wires 12 and 22 are easily bent by an external stress. Consequently, when the wires are provided and then the semiconductor device 1000 is to be worked, the wires 12 and 22 and the wires 11 and 21 may be shorted. As a result, yield rates for products obtained by working the semiconductor device 1000 may be decreased.

Moreover, since the positions of the pads for the semiconductor chips A and B are fixed in the conventional semiconductor device 1000, a degree of freedom in wiring design is low.

In accordance with the conventional semiconductor device 1000, wires for connecting the semiconductor A to the semiconductor B (e.g., the wires 12 and 14) may have different lengths. Thus, such wires may have various delay values.

The semiconductor chip B does not have marks for fixing the semiconductor A thereon. Thus, when the conventional semiconductor device 1000 is manufactured, it is difficult to adhere the semiconductor chip A on the semiconductor chip B so that the semiconductor chip A is securely fixed on a predetermined position of the semiconductor chip B.

When the semiconductor chip A and other semiconductor chip with the same size as the semiconductor chip A are adhered on the semiconductor chip B, the semiconductor chip A may be mistaken for the other semiconductor chip.

The semiconductor chip A is provided with only pads for wire bonding. Thus, the semiconductor chip A is connected to the semiconductor chip B only by wire bonding.

In accordance with the conventional semiconductor device 1000, since the space between the semiconductor chips A and B is not shielded at a ground potential, EMI (Electro Magnetic Interference) may occur thereat.

SUMMARY OF THE INVENTION

The present invention was developed in light of the above-described drawbacks and an object of the present invention is to provide a semiconductor device which is easily designed and manufactured and in which a plurality of semiconductor chips are integrally structured.

A semiconductor device of the present invention comprises a first semiconductor chip that includes a first internal circuit and at least one first conductive pad which is provided on its upper surface and is not connected to the first internal circuit; a second semiconductor chip provided on the first semiconductor chip that includes a second internal circuit and at least one second conductive pad which is provided on its upper surface and connected to the second internal circuit; at least one first connecting member for connecting the at least one first conductive pad to the at least one second conductive pad; and at least one second connecting member led from the at least one first conductive pad.

In accordance with the present invention, bent of connecting members occurred in a conventional semiconductor device can be suppressed. Accordingly, when the connecting members are provided and then a semiconductor device is worked, short of the connecting members can be prevented.

The at least one first connecting member may contact the point on the at least one first conductive pad which is different from the point the at least one second connecting member contacts.

Thus, it is possible to prevent the second connecting member led from the first conductive pad from contacting other components. Namely, a degree of freedom in designing wiring is improved.

Preferably, a plurality of the at least one first conductive pads are provided, a plurality of the at least one second conductive pads are provided, a plurality of the at least one first connecting member are provided, a plurality of the at least one second connecting member are provided, and two of the plurality of first connecting members have the same length.

A skew generated because of the difference in length between the first connecting members can be reduced.

A semiconductor device of the present invention comprises a first semiconductor chip that includes a plurality of first conductive pads provided on its upper surface; a second semiconductor chip that is provided on the first semiconductor chip and includes a plurality of second conductive pads provided on its upper surface; and a plurality of first connecting members for connecting the plurality of first conductive pads to the plurality of second conductive pads, wherein at least one of the plurality of first connecting members has a resistance value per unit length different from those of the other first connecting members.

In accordance with the present invention, a delay value can be adjusted for each of the first connecting members.

At least one of the plurality of first connecting members may be made of a material different from those of the other first connecting members.

The number of wires for at least one of the plurality of first connecting members may be different from those of the other first connecting members.

A semiconductor device of the present invention comprises a first semiconductor chip; and a second semiconductor chip provided on the first semiconductor chip, wherein fixing means for disposing the second semiconductor chip is provided on the first semiconductor chip.

In accordance with the present invention, a semiconductor device that a second semiconductor chip is securely fixed on a first semiconductor chip without misalignment can be obtained.

The fixing means may be a first convex portion with which the second semiconductor chip can engage.

Preferably, a second convex portion on which the second semiconductor chip can slide is formed at areas on the first semiconductor chip other than the area that the second semiconductor chip is to be disposed.

Even if the second semiconductor chip is disposed at areas other than the area that the second semiconductor chip should be originally disposed when being fixed on the first semiconductor chip, the second semiconductor chip slides on the second convex portions and is fixed on the area defined by the first convex portions.

A semiconductor device of the present invention comprises a first semiconductor chip; and a second semiconductor chip provided on the first semiconductor chip, wherein the first semiconductor chip has a first engagement portion, the second semiconductor chip has a second engagement portion, and the first engagement portion is fitted into the second engagement portion.

In accordance with the present invention, when being fixed on the first semiconductor chip, the second semiconductor chip is securely fixed on the first semiconductor chip without misalignment.

The semiconductor device may further comprise a third semiconductor chip provided on the first semiconductor chip, wherein the third semiconductor chip has a third engagement portion, the first semiconductor chip has a fourth engagement portion, the third engagement is fitted into the fourth engagement portion and the first engagement portion has different configuration from the third engagement portion.

If the third semiconductor chip is mistaken for the second semiconductor chip, the second semiconductor chip and the third semiconductor chip cannot be fixed on the first semiconductor chip. Thus, it is possible to prevent the second semiconductor chip from mistaken for the third semiconductor chip.

A semiconductor device of the present invention comprises a first semiconductor chip; and a second semiconductor chip provided on the first semiconductor chip, wherein a first mark indicating the area the second semiconductor chip is to be disposed is provided on the first semiconductor chip.

In accordance with the present invention, when the second semiconductor chip is fixed on the first semiconductor chip, it is possible to prevent the second semiconductor from mistaken for other semiconductor chips.

The semiconductor device may further comprise a third semiconductor chip provided on the first semiconductor chip, wherein a second mark indicating the area the third semiconductor chip is to be disposed is provided on the first semiconductor chip, the first mark is different from the second mark.

A semiconductor device of the present invention comprises an internal circuit; a wire bonding conductive pad connected to the internal circuit; and a bump connection pad connected to the internal circuit in parallel with the wire bond conductive pad.

In accordance with the present invention, if desired, a connection method for structuring a semiconductor device can be selected.

The semiconductor device may comprise a first surface; and a second surface opposing the first surface, wherein the wire bonding conductive pad and the bump connection pad are provided on the first surface.

A semiconductor device of the present invention comprises a first semiconductor chip that includes a plurality of first conductive pads provided on it upper surface; a second semiconductor chip provided on the first semiconductor chip that includes a plurality of second conductive pads provided on its upper surface; a plurality of first connecting members for connecting the plurality of first conductive pads to the plurality of second conductive pads; and a plurality of second connecting members led from the plurality of second conductive pads, with a ground potential beings supplied thereto.

In accordance with the present invention, as a plurality of connecting members are connected to a ground potential Vss, potentials of the plurality of connecting members are all fixed to the ground potential Vss. Thus, the space between the first semiconductor chip and the second semiconductor chip is substantially electrically shielded, and EMI (Electro Magnetic Interference) can be suppressed and prevented.

In accordance with the present invention, a method for designing semiconductor device which comprises a first semiconductor chip that includes a first internal circuit, a first conductive pad which is provided on its upper surface and is connected to the first internal circuit and a wire bond island serving as a conductive pad which is provided on its upper surface and is not connected to the first internal circuit; and a second semiconductor chip provided on the first semiconductor chip that includes a second internal circuit and a second conductive pad which is provided on its upper surface and is connected to the second internal circuit, wherein the first conductive pad is connected to the second conductive pad, and the first conductive pad is connected to externals, the method comprising the steps of: (a) determining a connection path which can be connected by wire bonding from the connection relationship between the internal circuits and the externals and the positions of the conductive pads; and (b) calculating, with respect to the connection path, the position of the wire bond island provided on the first semiconductor chip.

In accordance with the method for designing semiconductor device of the present invention, a semiconductor device that bent of connecting members occurred in a conventional semiconductor device is suppressed can be obtained.

A method for designing semiconductor device which comprises a first semiconductor chip that includes a first internal circuit, at least one first conductive pad which is provided on its upper surface and is connected to the first internal circuit and at least one wire bond island serving as a conductive pad which is provided on its upper surface and is not connected to the first internal circuit; and a second semiconductor chip provided on the first semiconductor chip that includes a second internal circuit and a second conductive pad which is provided on its upper surface and is connected to the second internal circuit, wherein the at least one first conductive pad is connected to the second conductive pad, and the at least one first conductive pad is connected to externals, the method comprising the steps of: (a) determining whether or not at least one connection path determined from the connection relationship between the internal circuits and the externals and the positions of the at least one first conductive pad and the second conductive pad can be connected by wire bonding; (b) calculating the position of the at least one wire bond island provided on the first semiconductor chip if it is determined in the step (a) that the at least one connection path can be connected by wire bonding; and (c) if it is determined in the step (a) that the connection path cannot be connected by wire bonding, calculating the position of the at least one wire bond island provided on the first semiconductor chip and then changing the configuration of the at least one wire bond island so that the connection path can be connected by wire bonding.

In accordance with the method for designing semiconductor device of the present invention, in connecting paths passing through wire bond islands, it is possible to prevent connecting members from contacting other components.

A plurality of the at least one first conductive pads are provided, the plurality of at least one connection paths are determined in the step (a), a plurality of the positions of the at least one wire bond islands are obtained in the step (b) or (c), the method preferably further comprises the step of: (d) with respect to two of the plurality of connection paths, changing the positions of the wire bond islands so that the distances between the first conductive pads and the wire bond islands are equal.

A semiconductor device that a skew generated at two connection paths by the difference between distances from the first conductive pad to a wire bond island is reduced can be obtained.

In accordance with the present invention, a method for designing semiconductor device which comprises a first semiconductor chip that includes a first internal circuit and a first conductive pad which is provided on its upper surface and is connected to the first internal circuit; and a second semiconductor chip provided on the first semiconductor chip that includes a second internal circuit and a second conductive pad which is provided on its upper surface and is connected to the second internal circuit, wherein the first conductive pad is connected to the second conductive pad, and the first conductive pad is connected to externals, the method comprising the steps of: (a) determining a connection path from the connection relationship between the internal circuits and the externals and the positions of the conductive pads; (b) when the connection path is connected by a connecting member, determining whether or not a delay value of the connection path is within a tolerance; and (c) if it is determined in the step (b) that the delay value of the connection path is not within a tolerance, changing the connecting member so that the delay value of the connection path is within a tolerance.

In accordance with the method for designing semiconductor device of the present invention, a delay value can be adjusted for each of the connection paths.

In the step (c), materials for the connecting member are changed so that the delay value of the connection path is within a tolerance.

In the step (c), the number of wires structuring the connecting member is changed so that the delay value of the connection path is within a tolerance.

In accordance with the present invention, a method for designing semiconductor device which comprises a first semiconductor chip and a second semiconductor chip provided on the first semiconductor chip, comprising the steps of: (a) determining the area on the first semiconductor chip that the second semiconductor chip is to be disposed from the arrangement relationship between the first semiconductor chip and the second semiconductor chip and configurations of the first semiconductor chip and second semiconductor chip; and (b) in order to form a first convex portion with which the second semiconductor chip engages, determining the arrangement of the first convex portion on the first semiconductor chip and the configuration of the first convex portion.

In accordance with the method for designing semiconductor device of the present invention, a semiconductor device that the second semiconductor chip is securely fixed on the first semiconductor chip without misalignment can be obtained.

Preferably, the method for designing semiconductor device further comprises the step of: (c) in order to form a second convex portion on which the second semiconductor chip can slide, determining the arrangement of the second convex portion on the first semiconductor chip and the configuration of the second convex portion.

Even if the second semiconductor chip is disposed at positions other than the area that the second semiconductor chip should be originally disposed when being fixed on the first semiconductor chip, the second semiconductor chip slides on the second convex portions and then is fixed on the area defined by the first convex portions.

In accordance with the present invention, a method for designing semiconductor device which comprises a first semiconductor chip and at least one second semiconductor chip provided on the first semiconductor chip, comprising the steps of: (a) determining the area on the first semiconductor chip that the at least one second semiconductor chip is to be disposed from the arrangement relationship between the first semiconductor chip and the at least one second semiconductor chip and configurations of the first semiconductor chip and the at least one second semiconductor chip; (b) detecting the number of the at least one second semiconductor chips; (c) if the number of the at least one second semiconductor chips is 1 in the step (b), determining the positions of a first engagement portion on the first semiconductor chip and a second engagement portion on the second semiconductor chip which is fitted into the first engagement portion and the configurations of the first engagement portion and the second engagement portion; and (d) if the number of the at least one second semiconductor chips is a plural number, determining the positions of the first engagement portions on the first semiconductor chip and the second engagement portions on the second semiconductor chips fitted into the first engagement portions and the configurations of the first engagement portions and the second engagement portions.

In accordance with the method for designing semiconductor device of the present invention, when fixed on the first semiconductor chip, the second semiconductor chip is securely fixed on the first semiconductor chip without misalignment. If a second semiconductor chip is mistaken for another second semiconductor chip, the respective second semiconductor chips cannot be fixed on the first semiconductor chip. Thus, it is possible to prevent a mistake among a plurality of second semiconductor chips.

In accordance with the present invention, a method for designing semiconductor device which comprises a first semiconductor chip and at least one second semiconductor chip provided on the first semiconductor chip, comprising the steps of: (a) determining the area on the first semiconductor chip that the at least one second semiconductor chip is to be disposed from the arrangement relationship between the first semiconductor chip and the at least one second semiconductor chip and the configurations of the first semiconductor chip and the at least one second semiconductor chip; (b) detecting the number of the at least one second semiconductor chips; (c) if the number of the at least one second semiconductor chips is 1 in the step (b), determining the configuration of a mark indicating the position on the first semiconductor chip that the second semiconductor chip is to be provided; and (d) if the number of the at least one second semiconductor chips is a plural number in the step (b), determining the configuration of marks indicating the positions on the first semiconductor chip that the second semiconductor chips are to be provided.

In accordance with the method for designing semiconductor device of the present invention, when fixed on the first semiconductor chip, the second semiconductor chip can be prevented from mistaken for other semiconductor chips. Further, when a plurality of second semiconductor chips are fixed on the first semiconductor chip, a mistake among the plurality of second semiconductor chips can be prevented.

In accordance with the present invention, a method for designing semiconductor device which comprises an internal circuit, comprising the step of determining, from a netlist and the configuration of semiconductor chip, the positions of wire bonding pad provided on the semiconductor chip and connected to the internal circuit and bump connection pad connected to the internal circuit in parallel with the wire bonding pad.

In accordance with the method for designing semiconductor device of the present invention, a semiconductor device that a connection method can be selected if desired can be obtained.

In accordance with the present invention, a method for designing semiconductor device which comprises a first semiconductor chip that includes a first internal circuit and a plurality of first conductive pad provided on its upper surface; and a second semiconductor chip provided on the first semiconductor chip that includes a second internal circuit and a plurality of conductive pads provided on it upper surface, wherein the first conductive pads are connected to the second conductive pads, and a ground potential is supplied to at least one of the plurality of first conductive pads, the method comprising the step of selecting a first conductive pad and a second conductive pad with a ground potential being applied thereto from the connection relationship between the internal circuits and the positions of the conductive pads.

In accordance with the method for designing semiconductor device of the present invention, a semiconductor device that by connecting selected first and second conductive pads to a ground potential by wire bonding, the space between the first semiconductor chip and the second semiconductor chip is substantially electrically shielded and EMI (Electro Magnetic Interference) is suppressed and prevented can be obtained.

In accordance with the present invention, a computer readable recording medium incorporated into a computer used for designing a semiconductor device which comprises a first semiconductor chip that includes a first internal circuit, a first conductive pad which is provided on its upper surface and is connected to the first internal circuit and a wire bond island serving as a conductive pad which is provided on its upper surface and is not connected to the first internal circuit and a second semiconductor chip provided on the first semiconductor chip which includes a second internal circuit and a second conductive pad which is provided on its upper surface and is connected to the second internal circuit, wherein the first conductive pad is connected to the second conductive pad and the conductive pad is connected to externals, recorded in the recording medium is the program for a computer to perform the steps of: (a) determining a connection path which can be connected by wire bonding from the connection relationship between the internal circuits and the externals and the positions of the conductive pads; and (b) calculating, with respect to the connection path, the position of the wire bond island provided on the first semiconductor chip.

In accordance with the present invention, a computer readable recording medium incorporated into a computer used for designing a semiconductor device which comprises a first semiconductor chip that includes a first internal circuit, at least one first conductive pad which is provided on it upper surface and is connected to the first internal circuit and at least one wire bond island serving as a conductive pad which is provided on its upper surface and is not connected to the first internal circuit and a second semiconductor chip provided on the first semiconductor chip that includes a second internal circuit and a second conductive pad which is provided on its upper surface and is connected to the second internal circuit, wherein the at least one first conductive pad is connected to the second conductive pad, and the at least one first conductive pad is connected to externals, recorded in the recording medium is the program for a computer to perform the steps of: (a) determining whether or not at least one connection path determined from the connection relationship between the internal circuits and the externals and the positions of the at least one first conductive pad and the second conductive pad can be connected by wire bonding; (b) if it is determined in the step (a) that the at least one connection path can be connected by wire bonding, calculating the position of the at least one wire bond island provided on the first semiconductor chip; and (c) if it is determined in the step (a) that the connection path cannot be connected by wire bonding, calculating the position of the at least one wire bond island provided on the first semiconductor chip and then changing the configuration of the at least one wire bond island so that the connection path can be connected by wire bonding.

In accordance with the present invention, a computer readable recording medium incorporated into a computer used for designing a semiconductor device which comprises a first semiconductor chip that includes a first internal circuit and a first conductive pad which is provided on it upper surface and is connected to the first internal circuit and a second semiconductor chip provided on the first semiconductor chip that includes a second internal circuit and a second conductive pad which is provided on its upper surface and is connected to the second internal circuit, wherein the first conductive pad is connected to the second conductive pad and the first conductive pad is connected to externals, recorded in the recording medium is the program for a computer to perform the steps of: (a) determining a connection path from the connection relationship between the internal circuits and the externals and the positions of the conductive pads; (b) when the connection path is connected by a connecting member, determining whether or not a delay value of the connection path is within a tolerance; and (c) if it is determined in the step (b) that the delay value of the connection path is not within a tolerance, changing the connecting member so that the delay of the connection path is within a tolerance.

In accordance with the present invention, a computer readable recording medium incorporated into a computer used for designing a semiconductor device which comprises a first semiconductor chip and a second semiconductor chip provided on the first semiconductor chip, recorded in the recording medium is the program for a computer to perform the steps of: (a) determining the area on the first semiconductor chip that the second semiconductor chip is to be mounted from the arrangement relationship between the first semiconductor chip and the second semiconductor chip and the configurations of the first semiconductor chip and the second semiconductor chip; and (b) determining the arrangement of a first convex portion on the first semiconductor chip and the configuration of the first convex portion in order to form the first convex portion the second semiconductor chip engages with.

In accordance with the present invention, a computer readable recording medium incorporated into a computer used for designing a semiconductor device which comprises a first semiconductor chip and at least one second semiconductor chip provided on the first semiconductor chip, recorded in the recording medium is the program for a computer to perform the steps of: (a) determining the area on the first semiconductor chip that the at least one second semiconductor chip is to be disposed from the arrangement relationship between the first semiconductor chip and the at least one second semiconductor chip and the configurations of the first semiconductor chip and the at least one second semiconductor chip; (b) detecting the number of the at least one second semiconductor chips; (c) if the number of the at least one second semiconductor chips is 1 in the step (b), determining the positions of a first engagement portion on the first semiconductor chip and a second engagement portion on the second semiconductor chip fitted into the first engagement portion and the configurations of the first engagement portion and the second engagement portion; and (d) if the number of the at least one second semiconductor chips is a plural number in the step (b), determining the positions of the first engagement portions on the first semiconductor chip and the second engagement portions on the second semiconductor chips fitted into the first engagement portions and the configurations of the first engagement portions and the second engagement portions.

In accordance with the present invention, a computer readable recording medium incorporated into a computer used for designing a semiconductor device which comprises a first semiconductor chip and at least one second semiconductor chip provided on the first semiconductor chip, recorded in the recording medium is the program for a computer to perform the steps of: (a) determining the area on the first semiconductor chip that the at least one second semiconductor chip is to be disposed from the arrangement relationship between the first semiconductor chip and the at least one second semiconductor chip and the configurations of the first semiconductor chip and the at least one second semiconductor chip; (b) detecting the number of the at least one second semiconductor chips; (c) if the number of the at least one second semiconductor chips is 1 in the step (b), determining the configuration of a mark indicating the position on the first semiconductor chip that the second semiconductor chip is to be provided; and (d) if the number of the at least one second semiconductor chips is a plural number in the step (b), determining the configuration of marks indicating the positions on the first semiconductor chip that the second semiconductor chips are to be provided.

In accordance with the present invention, a computer readable recording medium incorporated into a computer used for designing a semiconductor device with an internal circuit, recorded in the recording medium is the program for a computer to perform the step of determining, from a netlist and the configuration of a semiconductor chip, the positions of wire bonding pad provided on the semiconductor chip and connected to the internal circuit and bump connection pad connected to the internal circuit in parallel with the wire bonding pad.

In accordance with the present invention, a computer readable recording medium incorporated into a computer used for designing a semiconductor device which comprises a first semiconductor chip that includes a first internal circuit and a plurality of first conductive pads provided on its upper surface and a second semiconductor chip provided on the first semiconductor chip that includes a second internal circuit and a plurality of second conductive pads provided on its upper surface, wherein the first conductive pads are connected to the second conductive pads and a ground potential is supplied to at least one of the plurality of first conductive pads, recorded in the recording medium is the program for a computer to perform the step of selecting a first conductive pad and a second conductive pad with the ground potential being applied thereto from the connection relationship between the internal circuits and the positions of the conductive pads.

DETAILED DESCRIPTION OF THE INVENTION

Figure 1A:
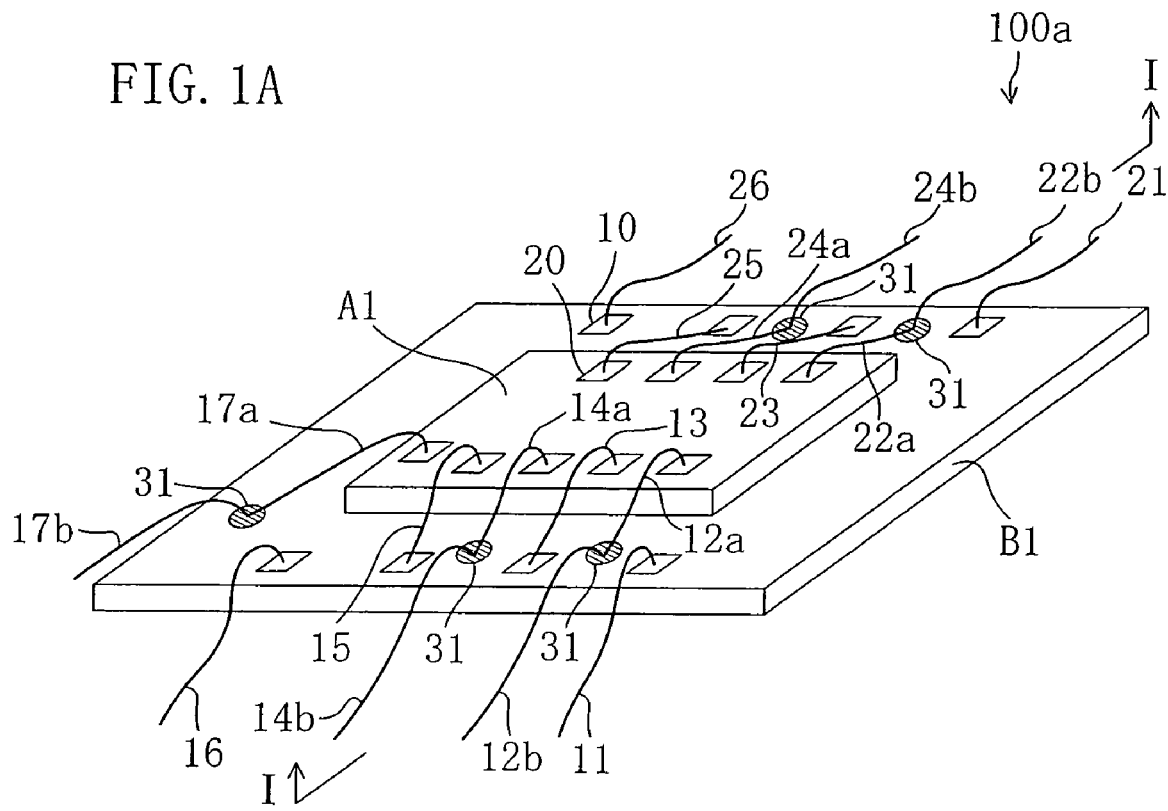
FIGS. 1A and 1B are perspective view illustrating the structure of a semiconductor device of embodiment 1.

Embodiments of the present invention will be described hereinafter with reference to the drawings. For convenience of explanation, component that are common throughout the embodiments are denoted by the same reference numerals. The term "connect" used herein means "electrically connect" unless otherwise mentioned.

—Semiconductor Device—

Embodiment 1

Figure 1B:
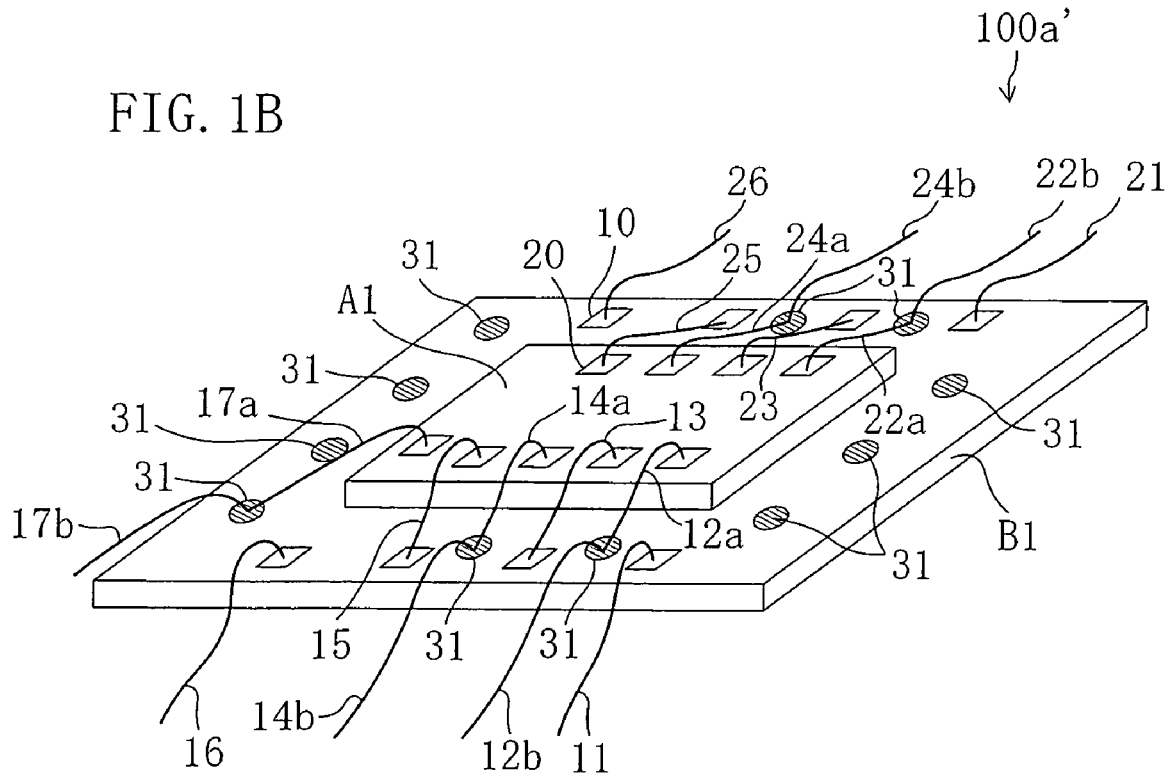
Figure 2:
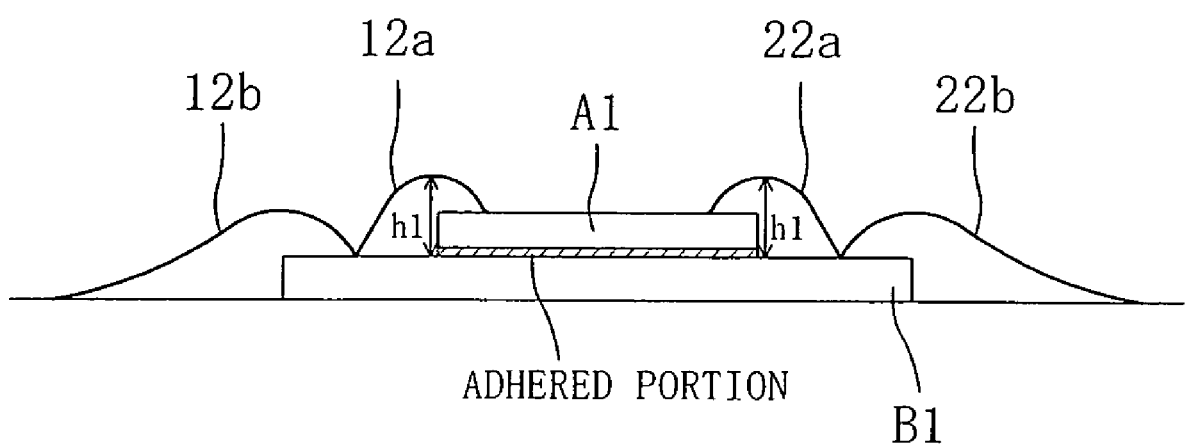
FIG. 2 is a cross-sectional view taken along a line I-I shown in FIG. 1.

This embodiment will be described with reference to FIGS. 1A, 1B and 2. FIGS. 1A and 1B are perspective views showing structures of semiconductor devices relating to this embodiment. FIG. 2 is a cross-sectional view taken along a line I-I shown in FIG. 1A.

As shown in FIG. 1A, a semiconductor device 100a of this embodiment has a semiconductor chip B1 which has an internal circuit (not shown) and a plurality of pads 10 connected to the internal circuit and a semiconductor chip A1 which has an internal circuit (not shown) and a plurality of pads 20 connected to the internal circuit and which is adhered on the semiconductor chip B1. As shown in FIG. 2, in accordance with the semiconductor device 100a of this embodiment, the semiconductor chip A1 is fixed on the semiconductor chip B1 with an adhered portion being interposed therebetween.

The semiconductor chip B1 is provided with the plurality of pads 10 connected to its internal circuit and a plurality of wire bond islands 31. The wire bond island 31 refers to as a conductive pad which is not connected to the internal circuit of the semiconductor chip B1.

The semiconductor device 100a of this embodiment further includes wires 13, 15, 23 and 25 connecting the pads 10 for the semiconductor B1 to the pads 20 for the semiconductor chip A1, wires 11, 16, 21 and 26 connecting the pads 10 for the semiconductor chip B1 to electrodes outside the semiconductor device 100a (e.g., leads of lead frame and electrodes for printed wiring board) and wires 12a, 12b, 14a, 14b, 17a, 17b, 22a, 22b, 24a and 24b connecting the pads 20 for the semiconductor chip A1 via the wire bond islands 31 to external electrodes.

In the semiconductor device 100a of this embodiment, suppose that the maximum distance from the wires 12a and 12b connecting a pad 20 of the semiconductor A1 to an electrode outside the semiconductor device 100a to the upper surface of the semiconductor chip B1 is indicated by h1. Then, h1<h. This is applicable to the wires 14a and 14b, the wires 17a and 17b and the wires 22a and 22b. Bent of wires as in the conventional semiconductor device 1000 is suppressed in the semiconductor device 100a of this embodiment. Accordingly, when wires are provided and then the semiconductor device 100a is to be worked, short of the wires can be prevented. Thus, yield rates for products obtained by working the semiconductor device 100a are improved.

By adjusting positions of the wire bond islands 31, lengths of wires can be made equal. For example, the wire 12a may be as long as the wire 17a, and the wire 12b may be as long as the wire 17b. Thus, skew caused by differences between the lengths of the wires is reduced. As a result, in accordance with the semiconductor device 100a of this embodiment, wirings for structuring synchronous circuits are easily designed.

In accordance with this embodiment, by adjusting the positions of the wire bond islands 31, the wires between the semiconductor chips A1 and B1 (specifically, the wires 12a, 14a, 17a, 22a and 24a) may be the same length and wiring delay values may also be the same value.

Next, a semiconductor device 100a' shown in FIG. 1B will be described. As shown in FIG. 1B, the semiconductor device 100a' has substantially same structure as that of the above-described semiconductor device 100a. The semiconductor device 100a' is different from the semiconductor device 100a only in that the semiconductor chip B1 has the wire bond islands 31 that are not used for wire bonding connection.

As in the semiconductor device 100a', when the semiconductor chip B1 has a plurality of wire bond islands 31 regardless of being used for wire bonding connection, a semiconductor chip which is different from the semiconductor chip A1 may be mounted by using appropriate wire bond islands 31. Namely, the semiconductor B1 may be widely used.

Embodiment 2

Figure 3:
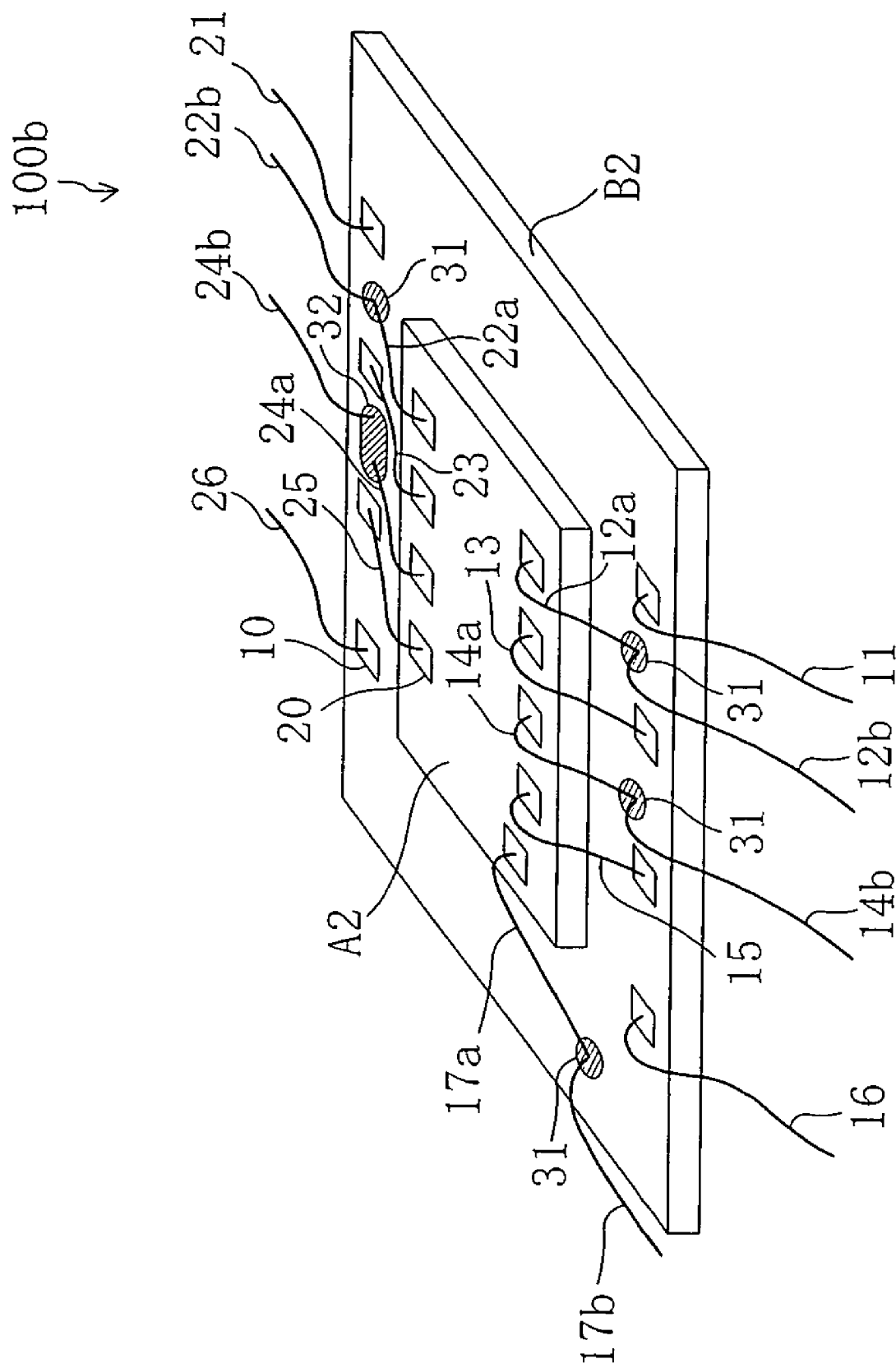
FIG. 3 is a perspective view illustrating the structure of a semiconductor device of embodiment 2.

This embodiment will be described with reference to FIG. 3. FIG. 3 is a perspective view illustrating the structure of a semiconductor device of this embodiment.

As shown in FIG. 3, a semiconductor device 100b of this embodiment has a semiconductor chip B2 which includes an internal circuit (not shown) and a plurality of pads 10 connected to the internal circuit and a semiconductor chip A2 which includes an internal circuit (not shown) and a plurality of pads 20 connected to the internal circuit and is adhered on the semiconductor chip B2.

The semiconductor chip B2 is provided with the plurality of pads 10 connected to the internal circuit and wire bond islands 31 and 32. Also in this embodiment, the wire bond island refers to as a conductive pad which is not connected to the internal circuit of the semiconductor chip B2. Unlike the wire bond islands 31, the wire bond islands 32 are formed in an elliptical configuration.

Further, the semiconductor device 100b of this embodiment includes wires 13, 15, 23 and 25 connecting the pads 10 for the semiconductor chip B2 to the pads 20 for the semiconductor chip A2, wires 11, 16, 21 and 26 connecting the pads 10 for the semiconductor chip B2 to external electrodes (e.g., leads of lead frame, electrodes for printed wiring board and the like) and wires 12a, 12b, 17a, 17b, 14a, 14b, 22a, 22b, 24a and 24b connecting the pads 20 for the semiconductor chip A2 via the wire bond islands 31 to external electrodes.

In accordance with this embodiment, unlike circular wire bond islands 31, the wire bond islands 32 are formed in an elliptical configuration. As shown in FIG. 3, the wire 24b is connected to the wire bond island 32 at a portion which is different from that the wire 24a is connected. For this reason, for example, when other component which becomes an obstacle when an external pad to be connected to the wire 24b is linearly connected to the position the wire 24a is connected exists, the wire 24b does not contact the other component. Namely, by changing the configuration of the wire bond islands, a degree of freedom in wiring design is improved.

The configuration of the wire bond islands 32 is not limited to an elliptical configuration and preferably, is appropriately changed to configurations enabling wires to be provided most efficiently.

In accordance with this embodiment, by adjusting the positions of the wire bond islands 31 and 32, the wires may have the same length. Thus, skew caused by differences between the lengths of the wires is reduced. As a result, in accordance with the semiconductor device 100b of this embodiment, wirings for structuring synchronous circuits are easily designed.

As in the above-described embodiment 1, in accordance with this embodiment, by adjusting the positions of the wire bond islands 31 and 32, the wires between the semiconductor chips A1 and B1 (specifically, the wires 12a, 14a, 17a, 22a and 24a) may have the same length and wiring delay values may also have the same value.

Embodiment 3

Figure 4:
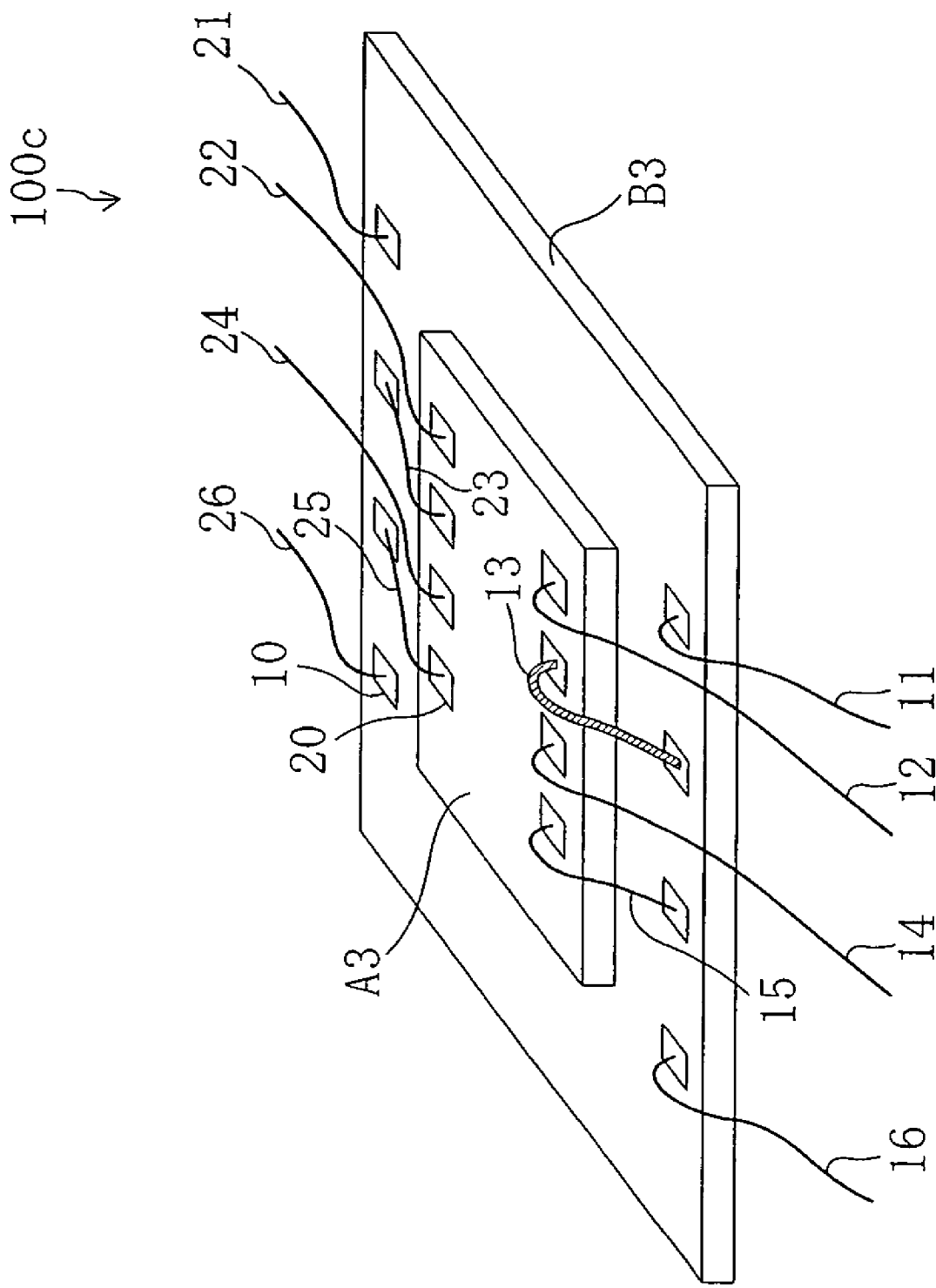
FIG. 4 is a perspective view illustrating the structure of a semiconductor device of embodiment 3.

This embodiment will be described with reference to FIG. 4. FIG. 4 is a perspective view illustrating the structure of a semiconductor device of this embodiment.

As shown in FIG. 4, a semiconductor device 100c of this embodiment has a semiconductor chip B3 which includes an internal circuit (not shown) and a plurality of pads 10 connected to the internal circuit and a semiconductor chip A3 which includes an internal circuit (not shown) and a plurality of pads 20 connected to the internal circuit and is adhered on the semiconductor chip B3.

Further, the semiconductor device 100c of this embodiment has wires 13, 15, 23 and 25 connecting the pads 10 for the semiconductor chip B3 to the pads 20 for the semiconductor chip A3, wires 11, 16, 21 and 26 connecting the pads 10 for the semiconductor chip B3 to external electrodes (e.g., leads of lead frame, electrodes for printed wiring board and the like) and wires 12, 14, 22 and 24 connecting the pads 20 for the semiconductor chip A3 to external electrodes. The wire 13 is especially made of gold and is different from other wires made of aluminum.

In accordance with this embodiment, the wire 13 is made of gold whose resistance is different from those of the other wires made of aluminum. By selecting materials for wires for each of the wires, a delay value may be adjusted for each of the wires. Although aluminum and gold are used for forming wires in this embodiment, the present invention does not limit such materials. For example, silver, copper, platinum may be used.

Embodiment 4

Figure 5:
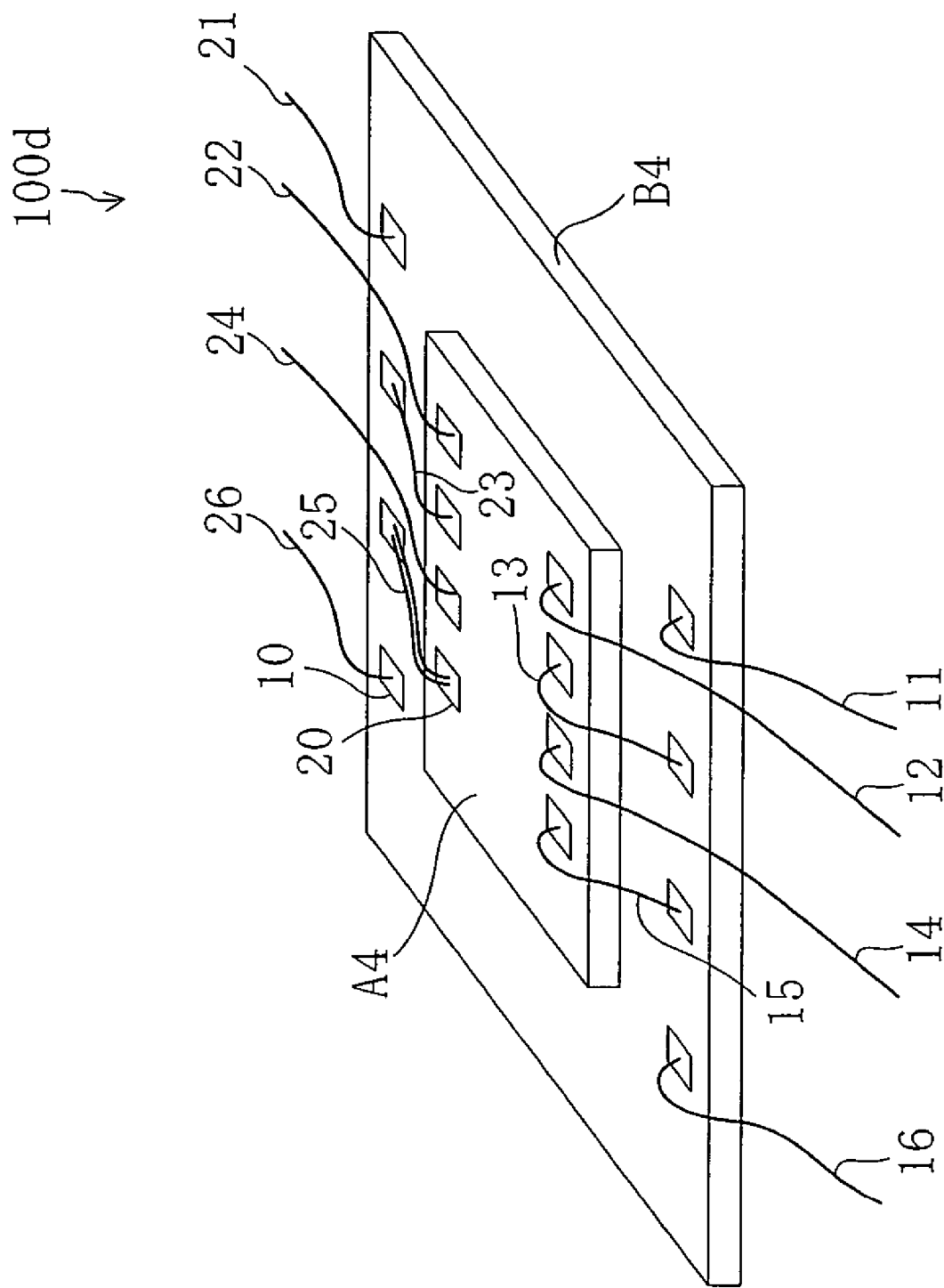
FIG. 5 is a perspective view illustrating the structure of a semiconductor device of embodiment 4.

This embodiment will be described with reference to FIG. 5. FIG. 5 is a perspective view illustrating the structure of a semiconductor device of this embodiment.

As shown in FIG. 5, a semiconductor device 100d of this embodiment has a semiconductor chip B4 which includes an internal circuit (not shown) and a plurality of pads 10 connected to the internal circuit and a semiconductor chip A4 which includes an internal circuit (not shown) and a plurality of pads 20 connected to the internal circuit and is adhered on the semiconductor chip B4.

Further, the semiconductor device 100d of this embodiment has wires 13, 15, 23 and 25 connecting the pads 10 for the semiconductor chip B4 to the pads 20 for the semiconductor chip A4, wires 11, 16, 21 and 26 connecting the pads 10 for the semiconductor chip B4 to external electrodes (e.g., leads of lead frame, electrodes for printed wiring board and the like) and wires 12, 14, 22 and 24 connecting the pads 20 for the semiconductor chip A4 to external electrodes. Especially in this embodiment, the wire 25 is made of two wires.

Because of the wire 25 being made of two wires, a wiring resistance can be reduced. Namely, by adjusting the number of wires for each of the wires, a delay value may be adjusted for each of the wires.

As described above, in accordance with this embodiment, a semiconductor device which is easily designed and manufactured and in which a plurality of semiconductor chips are integrally structured is obtained. A semiconductor device which is suitable for, in particular, high speed operation is obtained.

Embodiment 5

Figure 6:
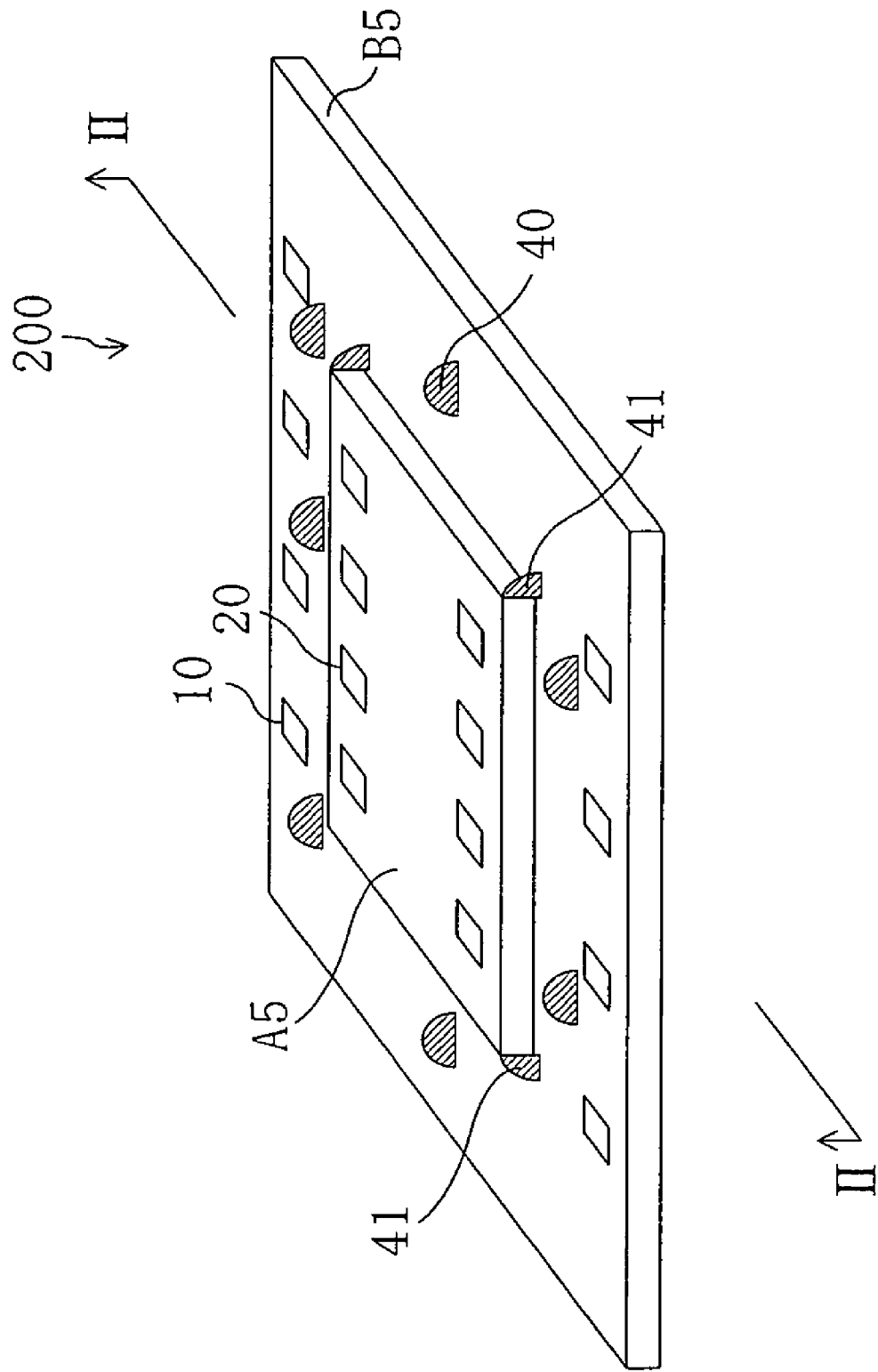
FIG. 6 is a perspective view illustrating the structure of a semiconductor device of embodiment 5.
Figure 7:
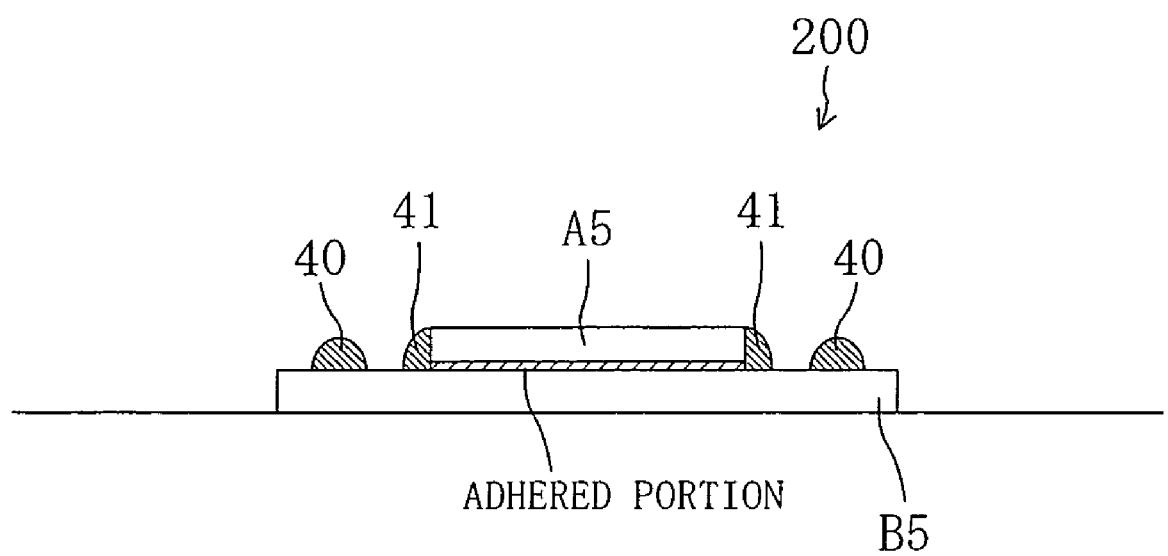
FIG. 7 is a cross-sectional view taken along a line II-II shown in FIG. 6.

This embodiment will be described with reference to FIGS. 6 and 7. FIG. 6 is a perspective view illustrating the structure of a semiconductor device of this embodiment. FIG. 7 is a cross-sectional view taken along a line II-II shown in FIG. 6. In this embodiment, wires are not shown in order to eliminate complicated descriptions.

As shown in FIGS. 6 and 7, a semiconductor device 200 of this embodiment has a semiconductor chip B5 which includes an internal circuit (not shown) and a plurality of pads 10 connected to the internal circuit and a semiconductor chip A5 which includes an internal circuit (not shown) and a plurality of pads 20 connected to the internal circuit and is adhered on the semiconductor chip B5 with an adhered portion being interposed therebetween.

The semiconductor chip B5 further has convex portions 41 and convex portions 40 for sliding.

The convex portions 41 are provided at corners of an area on the upper surface of the semiconductor chip B5 where the semiconductor chip A5 is to be adhered so as to define the area where the semiconductor chip A5 is to be adhered.

A large number of the convex portions 40 for sliding are provided on the area on the upper surface of the semiconductor chip B5 other than the area the semiconductor chip A5 is to be adhered. The convex portions 40 for sliding are disposed so that areas with sufficient size and configuration for the semiconductor chip A5 to be adhered thereon are not formed between the convex portions 40 for sliding.

In accordance with the semiconductor device 200 of the present invention, the convex portions 41 are provided on the upper surface of the semiconductor chip B5 so as to define the area the semiconductor chip A5 is to be adhered. Thus, when the semiconductor chip A5 is to be adhered on the semiconductor chip B5 in a process for manufacturing the semiconductor device 200, the semiconductor chip A5 is reliably fixed without misalignment.

Further, in accordance with this embodiment, the convex portions 40 for sliding disposed so that areas with sufficient size and configuration for the semiconductor chip A5 to be adhered thereon are not formed are provided on the upper surface of the semiconductor chip B5. For this reason, even if the semiconductor chip A5 is placed on a position other than the area where the semiconductor A5 should be originally adhered when being adhered on the semiconductor B5 in the process for manufacturing the semiconductor device 200, the semiconductor chip A5 slides on the convex portions 40 for sliding and is surely adhered on the area defined by the convex portions 41.

The semiconductor chip A5 needs not to be aligned with the semiconductor chip B5 when being adhered thereon.

Accordingly, in accordance with this embodiment, the semiconductor chip A5 can be easily adhered on the semiconductor chip B5.

Embodiment 6

Figure 8:
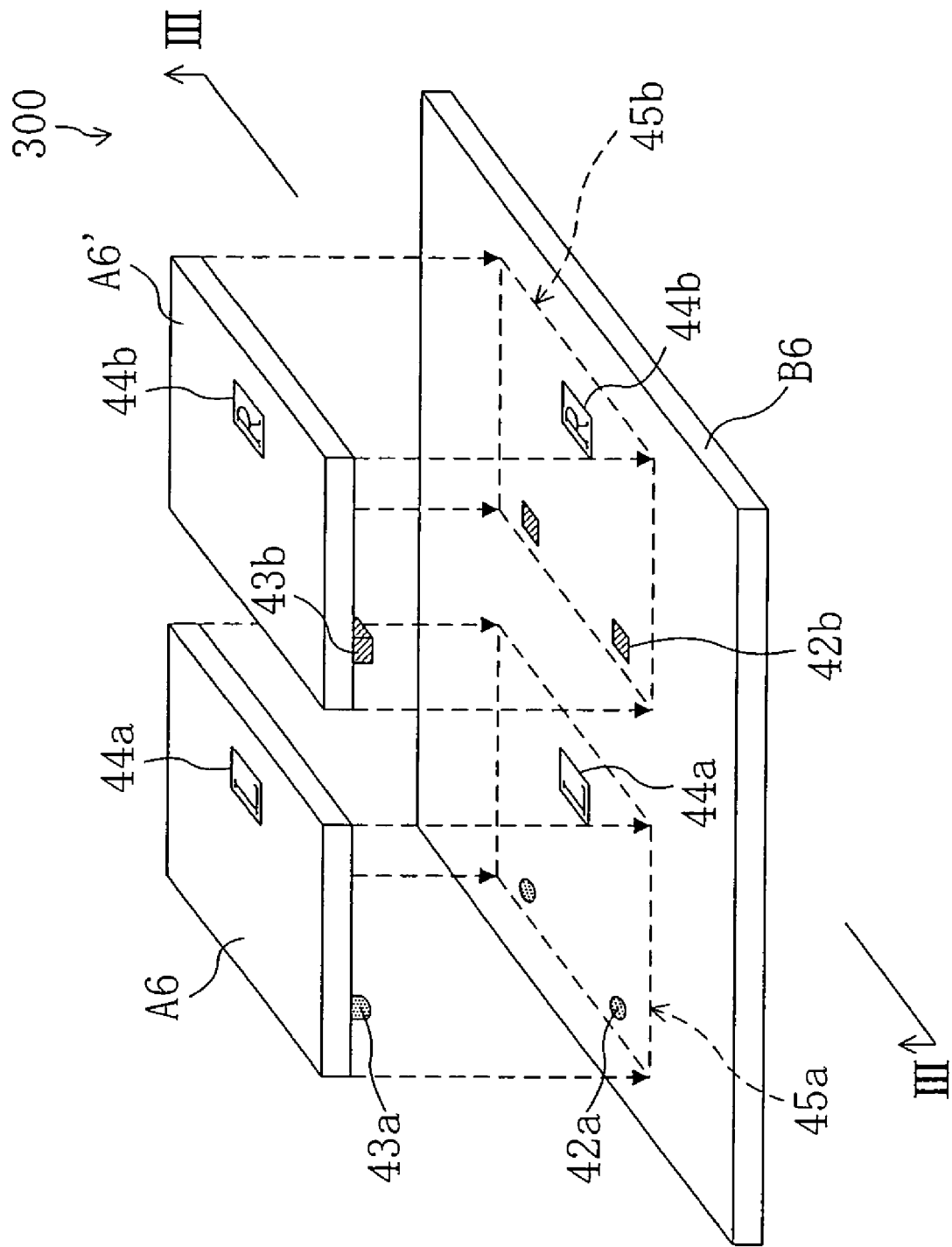
FIG. 8 is a perspective view illustrating the structure of a semiconductor device of embodiment 6.
Figure 9:
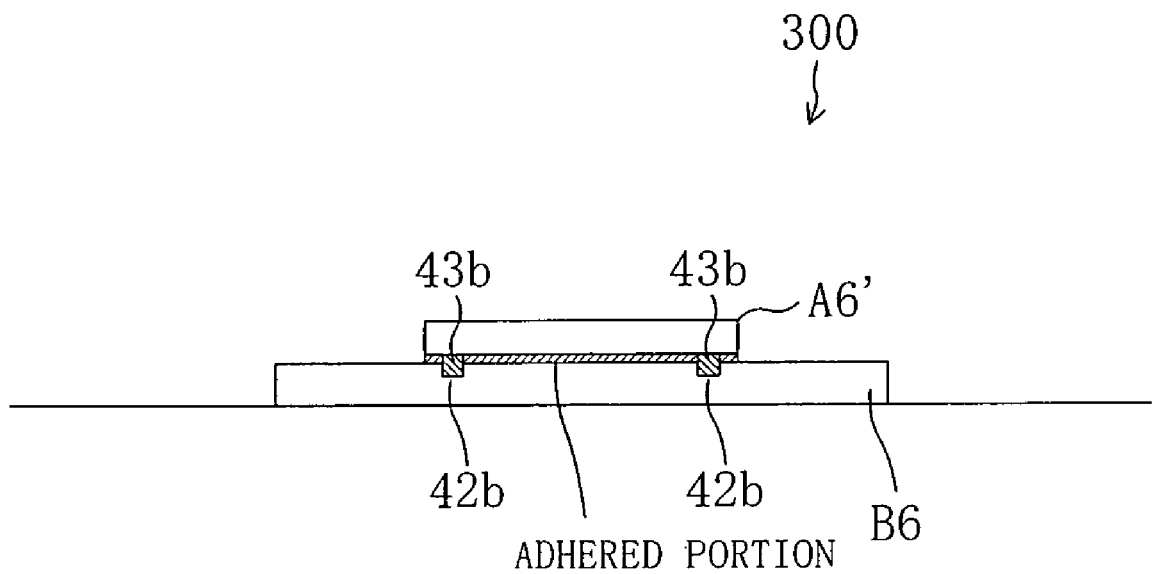
FIG. 9 is a cross-sectional view taken along a line III-III shown in FIG. 8.

This embodiment will be described with reference to FIGS. 8 and 9. FIG. 8 is a perspective view illustrating the structure of a semiconductor device of this embodiment. FIG. 9 is a cross-sectional view taken along a line III-III shown in FIG. 8.

As shown in FIG. 8, a semiconductor device 300 of this embodiment has a semiconductor chip B6 which includes an internal circuit (not shown) and a plurality of pads connected to the internal circuit and semiconductor chips A6 and A6' each of which includes an internal circuit (not shown) and a plurality of pads connected to the internal circuit and is provided on the semiconductor chip B6. Wires and pads are not shown in this embodiment in order to eliminate complicated descriptions.

Especially in accordance with this embodiment, the semiconductor chip B6 has circular openings 42a and rectangular openings 42b. The semiconductor chip A6 has convex portions 43a with circular cross-sectional configuration and the semiconductor chip A6' has convex portions 43b with rectangular cross-sectional configuration. As shown in FIG. 9, the semiconductor chip A6' is adhered to the semiconductor chip B6 with an adhered portion being interposed therebetween. The convex portions 43b of the semiconductor chip A6' are fitted into the openings 42b of the semiconductor chip B6. Similarly, the semiconductor chip A6 is also adhered to the semiconductor chip B6 with an adhered portion being interposed therebetween. The convex portions 43a of the semiconductor chip A6 are fitted into the openings 42a of the semiconductor chip B6.

In accordance with the semiconductor device 300 of this embodiment, a mark 44a for chip arrangement is printed on an area 45a of the upper surface of the semiconductor chip B6 that the semiconductor chip A6 is adhered. A mark 44b for chip arrangement is printed on an area 45b that the semiconductor chip A6' is adhered.

In accordance with the semiconductor device 300 of this embodiment, the semiconductor chip A6 is provided with the convex portions 43a, the semiconductor chip A6' is provided with the convex portions 43b and the semiconductor chip B6 is provided with the openings 42b and the openings 42a, so that when the semiconductor chips A6 and A6' are adhered to the semiconductor chip B6, the convex portions 43a are fitted into the openings 42a and the convex portions 43b are fitted into the openings 42b. Thus, when the semiconductor chips A6 and A6' are to be adhered to the semiconductor chip B6 in a process for manufacturing the semiconductor device 300, the semiconductor chip A6 is securely fixed on the semiconductor chip B6 without misalignment.

Especially in accordance with this embodiment, the convex portions 43a and the openings 42a have a cylindrical configuration, and the convex portions 43b and the openings 42b have a square pole configuration. For this reason, if the semiconductor chip A6 is mistaken for the semiconductor chip A6', the semiconductor chips A6 and A6' cannot be adhered on the semiconductor chip B6. Thus, it is possible to prevent a semiconductor device from being structured with the semiconductor A6 being mistaken for the semiconductor chip A6'.

Although the convex portions 43a and the openings 42a have a cylindrical configuration and the convex portions 43b and the openings 42b have a square pole configuration in this embodiment, the present invention is not limited such case. For example, the convex portions 43a and the openings 42a may have any configurations including a star-shaped pole configuration, a triangle pole configuration and the like.

The area 45a on the semiconductor chip B6 the semiconductor chip A6 is adhered is provided with the mark 44a for chip arrangement serving as a mark for fixing the semiconductor chip A6. The area 45b on the semiconductor chip B6 the semiconductor chip A6' is adhered is provided with the mark 44b for chip arrangement serving as a mark for fixing the semiconductor chip A6'. Thus, when the semiconductor chips A6 and A6' are to be adhered on the semiconductor chip B6 in the process for manufacturing the semiconductor device 300, the semiconductor chip A6 is seldom mistaken by the semiconductor chip A6'.

In accordance with this embodiment, the semiconductor chips A6 and A6' are electrically connected to the semiconductor chip B6 by wire bonding. Nevertheless, the present invention is not limited to such case. The semiconductor chips A6 and A6' may be electrically connected to the semiconductor chip B6 by bumps. Further, wire bonding and bump connection may be used together.

Embodiment 7

Figure 10:
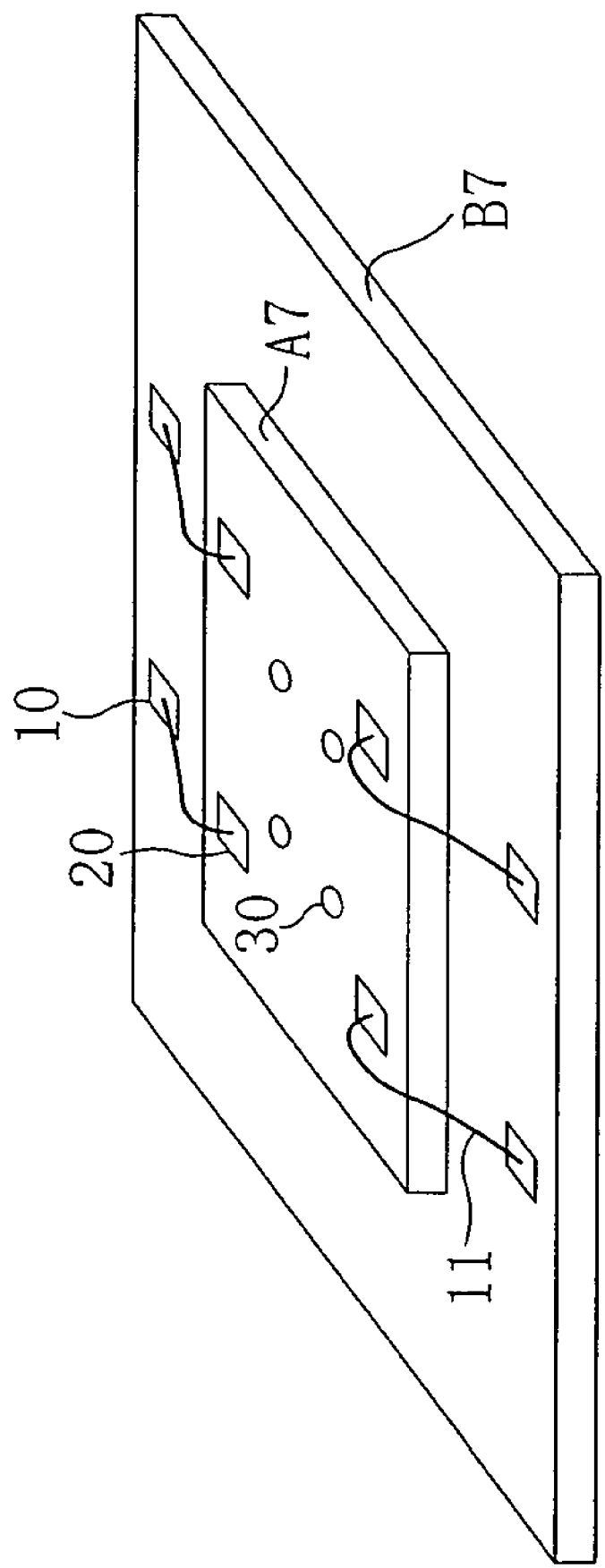
FIG. 10 is a typical view illustrating the structure of a semiconductor device of embodiment 7.
Figure 11:
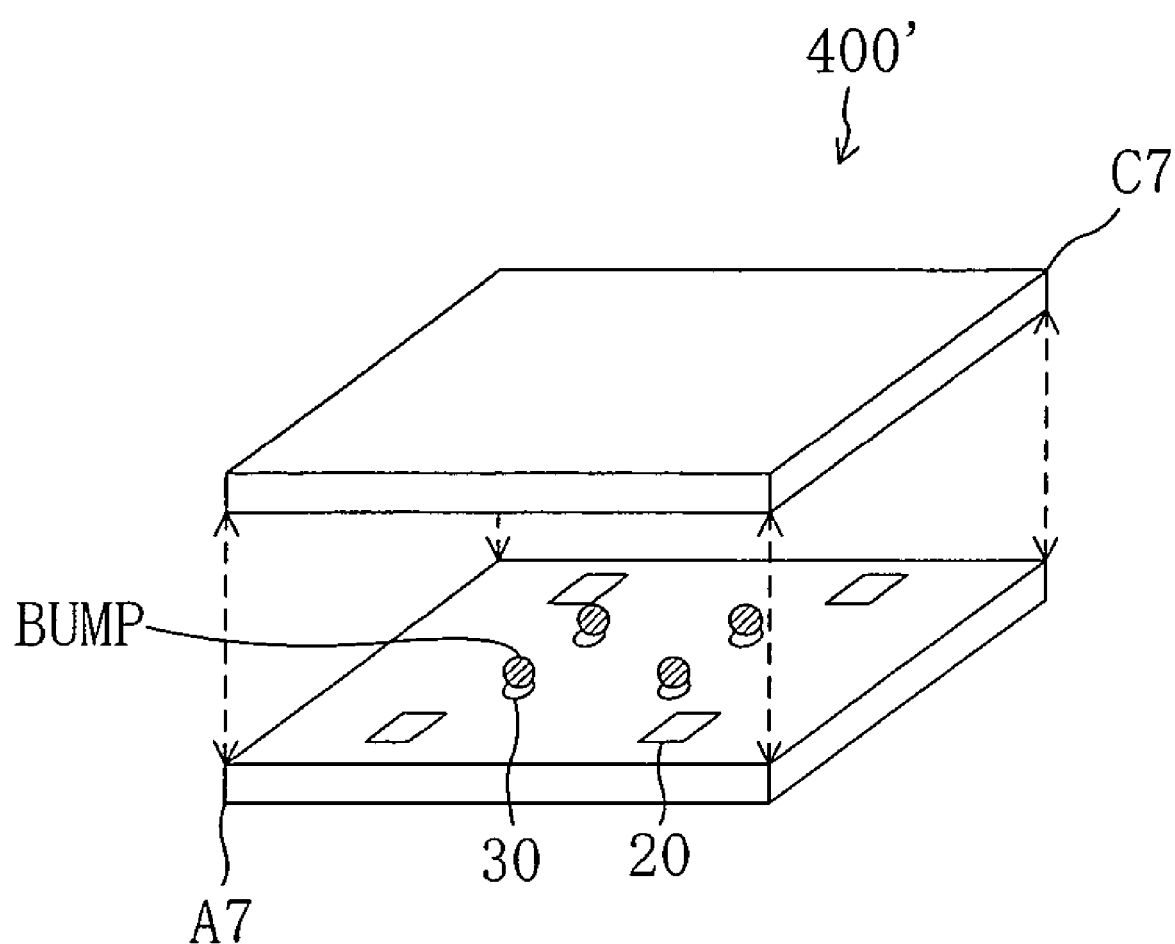
FIG. 11 is a typical view illustrating another structure of the semiconductor device of embodiment 7.

This embodiment will be described with reference to FIGS. 10 and 11. FIGS. 10 and 11 are typical views illustrating the structure of a semiconductor device of this embodiment.

As shown in FIG. 10, a semiconductor device 400 of this embodiment has a semiconductor chip B7 which includes an internal circuit (not shown) and a plurality of pads 10 connected to the internal circuit and a semiconductor chip A7 which includes an internal circuit (not shown) and a plurality of pads 20 for wire bonding connected to the internal circuit and is adhered on the semiconductor chip B7. In accordance with the semiconductor device 400, the semiconductor chip A7 is connected to the semiconductor chip B7 by wires 11 connecting the pads 10 for the semiconductor chip B7 to the pads 20 for the semiconductor chip A7.

As shown in FIG. 11, a semiconductor device 400' of this embodiment has a semiconductor chip A7 which includes an internal circuit (not shown) and a plurality of bump connection pads 30 connected to the internal circuit and a semiconductor chip C7 which includes an internal circuit (not shown) and a plurality of bump connection pads (not shown) provided on the lower surface thereof and connected to the internal circuit and which is provided on the semiconductor chip A7. In accordance with the semiconductor device 400', the pads 30 for the semiconductor chip A7 are connected to the bump connection pads of the semiconductor chip C7 by bump connection.

As shown in FIGS. 10 and 11, the semiconductor chip A7 is used in the semiconductor devices 400 and 400' of this embodiment.

The wire bonding pads 20 and the bump connection pads 30 are provided on the upper surface of the semiconductor chip A7. Thus, as shown in FIG. 11, when the semiconductor chip C7 with, on its lower surface, wires (not shown) enabling bump connection to the bump pads 30 of the semiconductor chip A7 is prepared, the semiconductor chip C7 can be bump-connected by fillip chip bonding.

Figure 12:
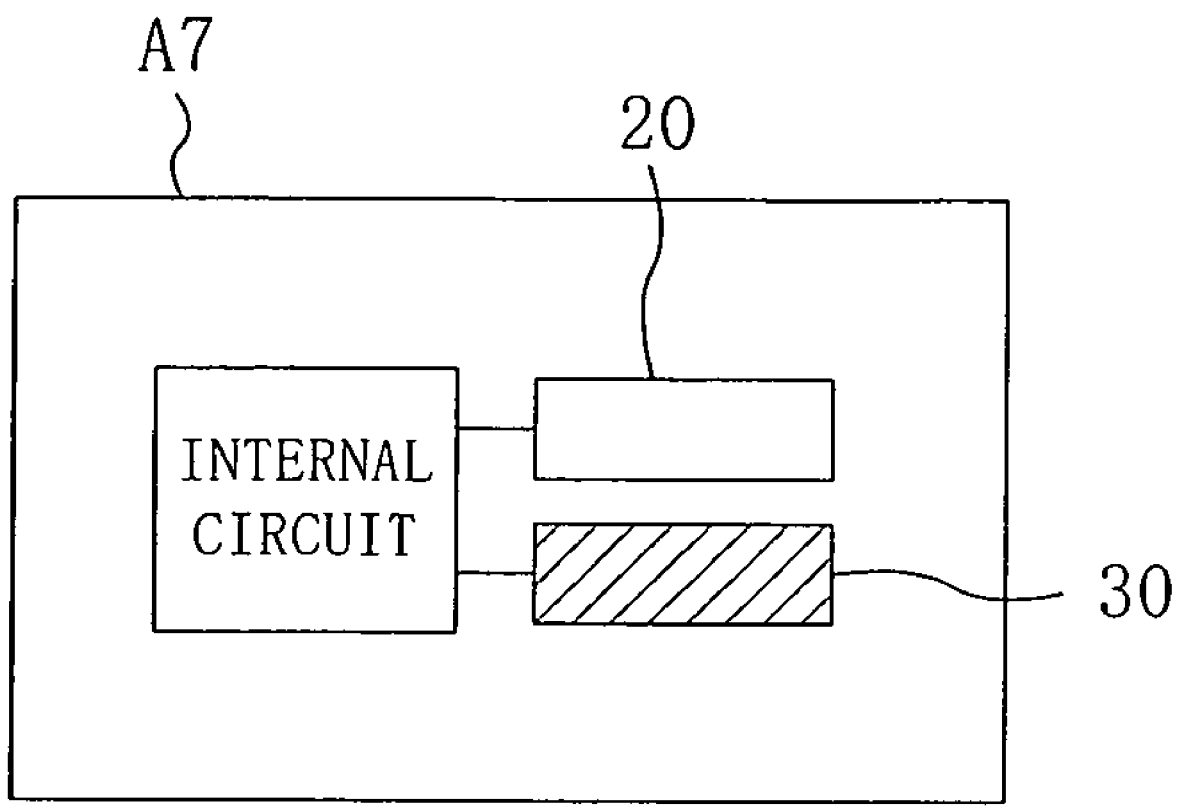
FIG. 12 is a view illustrating a circuit structure.

The semiconductor chip A7 of this embodiment includes the bump connection pads 30 on its upper surface with the plurality of pads 20 being provided thereat and an circuit shown in FIG. 12. FIG. 12 shows the structure of the circuit for the semiconductor chip A7 of this embodiment.

In accordance with this embodiment, as shown in FIG. 12, a wire bonding pad 20 and a bump connection pad 30 are connected to the internal circuit in the semiconductor chip A7. Thus, the semiconductor chip A7 can be connected to the semiconductor chip B7 by wire bonding and to the semiconductor chip C7 by bump connection.

Accordingly, both of the semiconductor device 400 shown in FIG. 10 and the semiconductor device 400' shown in FIG. 11 can be manufactured.

The wire bonding connection is cheaper than the bump connection. When a semiconductor device formed of semiconductor chips with substantially the same size is manufactured as shown in FIG. 11, the bump connection is easier.

In general, the wire bonding pads may be provided at 80 μm of minimum intervals therebetween. On the other hand, the bump connection pads may be provided at 5 μm of minimum intervals therebetween. Thus, in accordance with this embodiment, when a semiconductor device must be made compact or when semiconductor chips with high integration level are used, two semiconductor chips may be connected with each other by using bump connection pads, so that a semiconductor device can be easily manufactured.

As described above, in accordance with this embodiment, an optimal connection method for structuring a semiconductor device can be selected depending on manufacturing costs, sizes of the semiconductor chips A7, B7 and C7, wiring rules and the like. Namely, a degree of freedom in designing a semiconductor chip and a semiconductor device may be significantly improved.

Embodiment 8

Figure 13:
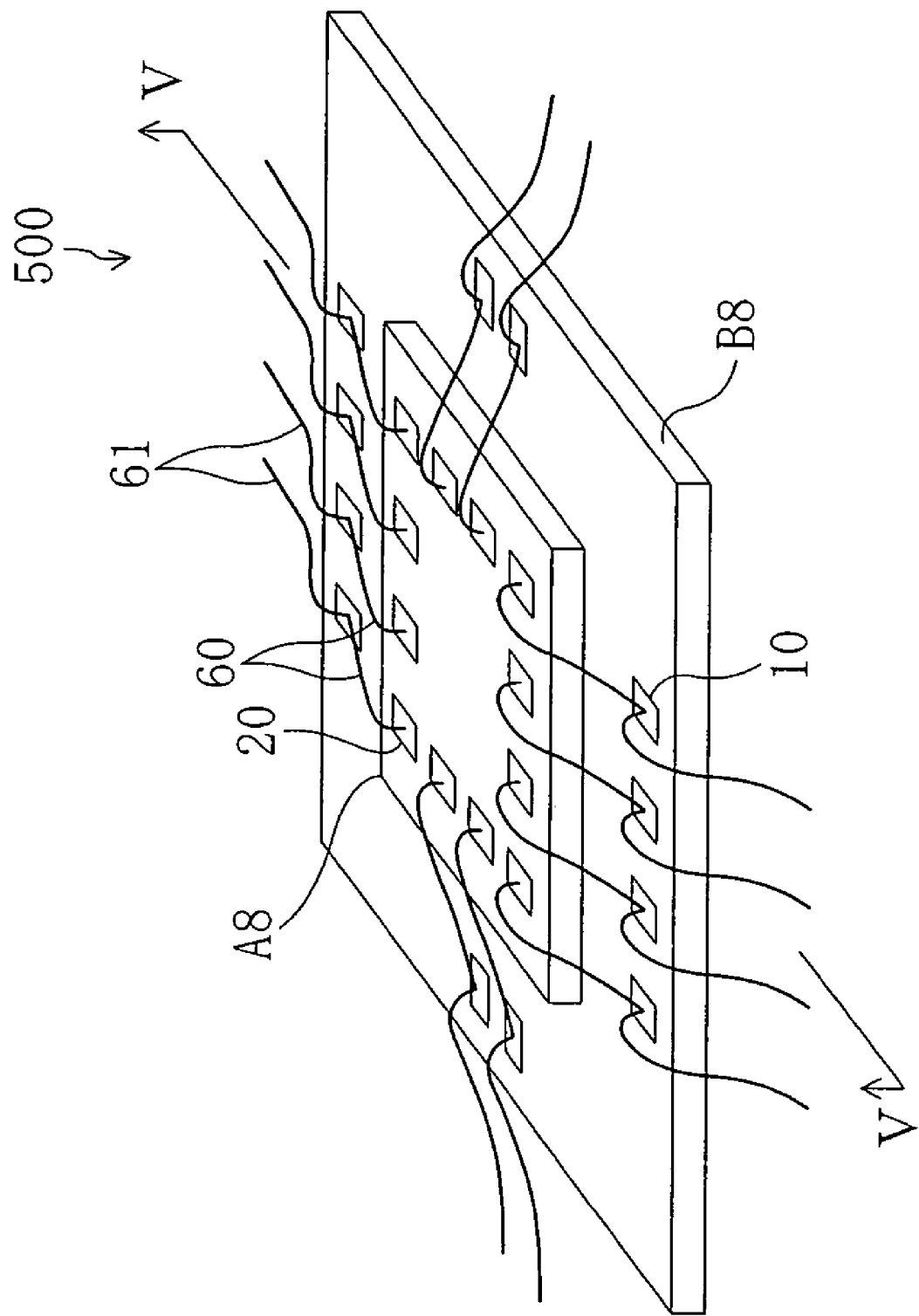
FIG. 13 is a perspective view illustrating the structure of a semiconductor device of embodiment 8.
Figure 14:
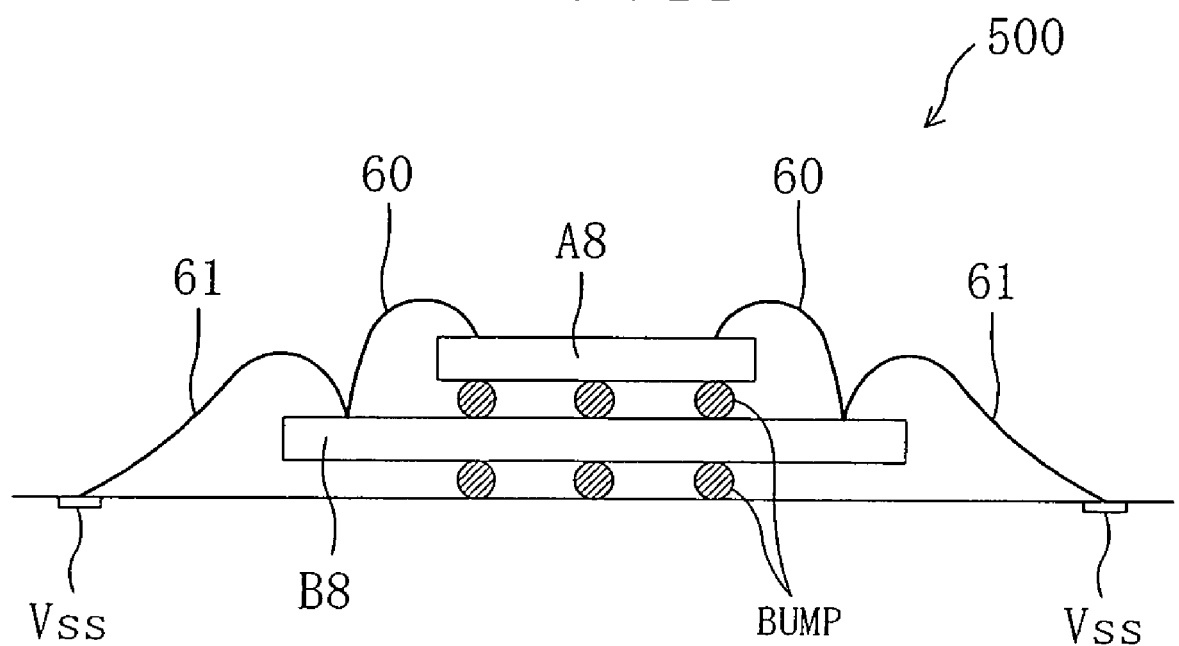
FIG. 14 is a cross-sectional view taken along a line V-V shown in FIG. 13.

This embodiment will be described with reference to FIGS. 13 and 14. FIG. 13 is a perspective view illustrating a semiconductor device of this embodiment. FIG. 14 is a cross-sectional view taken along a line V-V shown in FIG. 13.

As shown in FIG. 13, a semiconductor device 500 of this embodiment has a semiconductor chip B8 which includes a plurality of pads 10 and a semiconductor chip A8 which includes a plurality of pads 20 and is adhered on the semiconductor chip B8.

Further, the semiconductor device 500 of this embodiment has wires 60 connecting the pads 10 for the semiconductor chip B8 to the pads 20 for the semiconductor chip A8 and wires 61 connecting the pads 10 for the semiconductor chip B8 to externals (group potential Vss).

As shown in FIG. 14, in accordance with the semiconductor device 500 of this embodiment, bump connection pads (not shown) connected to an internal circuit (not shown) are provided on the lower surface of the semiconductor chip A8. Bump connection pads (not shown) connected to an internal circuit (not shown) are also provided on the upper and the lower surfaces of the semiconductor chip B8.

The internal circuit for the semiconductor chip A8 is connected to the internal circuit for the semiconductor chip B8 by bump connection. The internal circuit for the semiconductor chip B8 is bump-connected to externals by using the bump connection pads provided on the lower surface of the semiconductor chip B8.

In accordance with this embodiment, since all of the plurality of wires 60 and 61 are connected to a ground potential Vss, potentials of the plurality of wires 60 and 61 are fixed at the ground potential Vss. Thus, in the semiconductor device 500, the space between the semiconductor chips A8 and B8 is substantially electrically shielded. In accordance with the semiconductor device 500, EMI (Electro Magnetic Interference) is suppressed and prevented. Namely, in accordance with this embodiment, a semiconductor device with significantly high reliability is obtained.

—Method For Designing Semiconductor Device—

Figure 15:
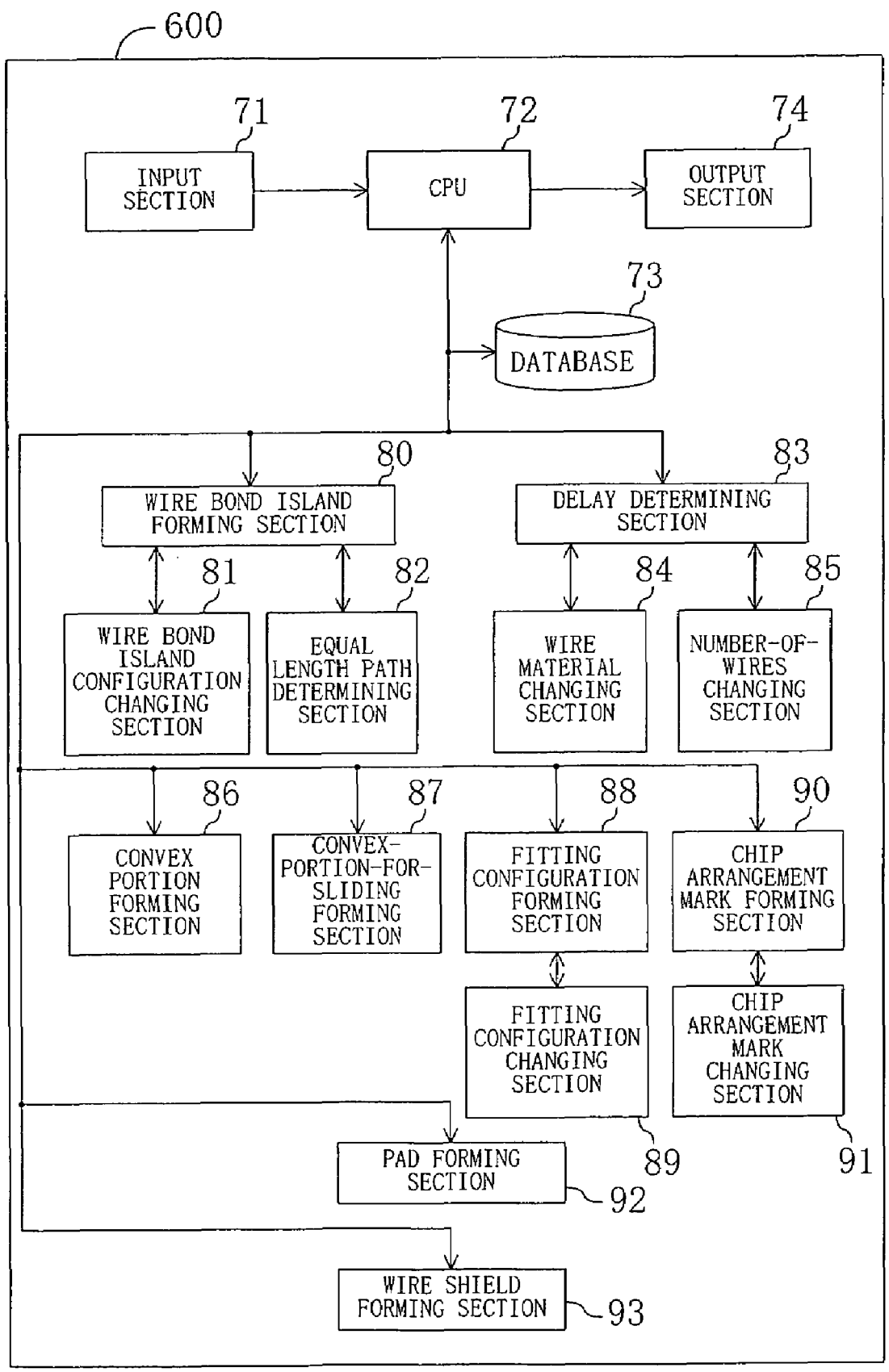
FIG. 15 is a block diagram illustrating the structure of a design device of the present invention.

A method for designing the semiconductor devices 100a to 100d, and 200 to 500 shown in the above-described embodiments 1 to 8 in order to manufacture the same will be described hereinafter. FIG. 15 is a block diagram illustrating the structure of design device used for manufacturing the semiconductor devices 100a to 100d and 200 to 500.

As shown in FIG. 15, a design device 600 of this embodiment comprises an input section 71 data is inputted, a CPU 72 which treats the data inputted to the input section 71, a database 73 which stores the data, an output section 74 which outputs results of treatment in the CPU 72, a wire bond island forming section 80 for forming wire bond islands, a wire bond island configuration changing section 81 for changing configurations and materials for wire bond islands determined by the wire bond island forming section 80, an equal length path determining section 82 for determining connection paths whose lengths should be equal, a delay determining section 83 for determining a delay, a wire material changing section 84 changing to wire materials with delay values within a range determined by the delay determining section 83, a number-of-wires changing section 85 for changing to the number of wires in order to obtain a delay value within a range determined by the delay determining section 83, a convex portion forming section 86 for forming convex portions defining an area a semiconductor chip is to be disposed, a convex-portion-for-sliding forming section 87 for forming convex portions enabling sliding of semiconductor chips, a fitting configuration forming section 88 for forming configurations fitting with each other when two semiconductor chips are adhered with each other, a fitting configuration changing section 89 for changing fitting configurations determined by the fitting configuration forming section 88, a mark-for-chip-arrangement forming section 90 for forming a mark for chip arrangement on the surface of semiconductor chip, a mark-for-chip-arrangement changing section 91 for changing a mark for chip arrangement determined by the chip-for-mark-arrangement forming section 90, a pad forming section 92 for forming wire bonding pads and bump connection pads and a wire shield forming section 93 for forming wire shields.

A method for designing semiconductor device will be described in the following embodiments with reference to FIGS. 16 to 26. Design methods represented by flowcharts shown in FIGS. 16 to 26 are used in order to design a semiconductor device by the design device 600.

Embodiment 9

Figure 16:
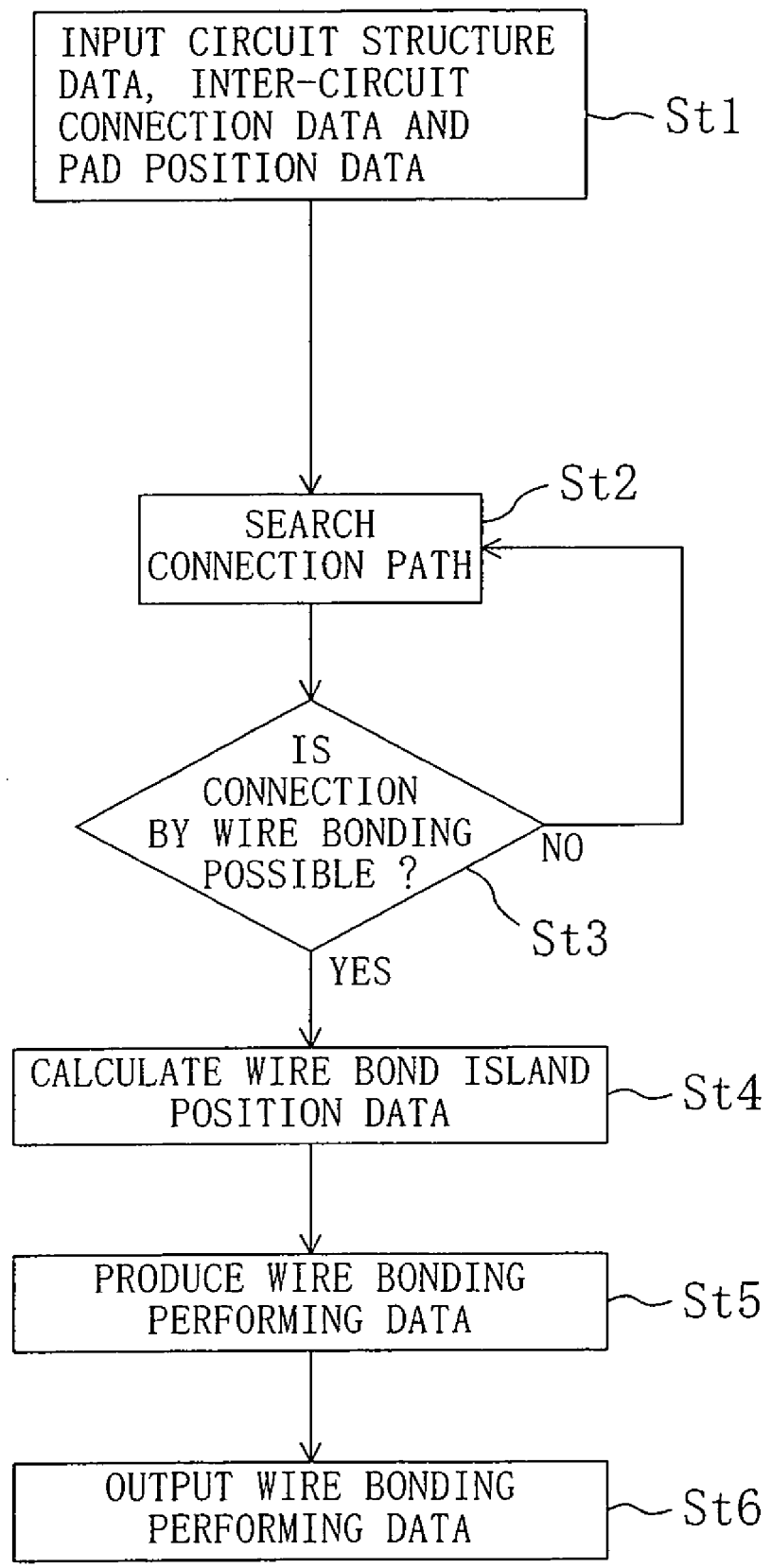
FIG. 16 is a flowchart illustrating operations of the design device in accordance with embodiment 9.

A method for designing the semiconductor device 100a of the embodiment 1 will be described in this embodiment. FIG. 16 is a flowchart illustrating operations of the design device 600 when the semiconductor device 100a of the embodiment 1 is designed.

As shown in FIG. 16, firstly in step St1, circuit structure data, inter-circuit connection data and pad position data are inputted to the input section 71. The circuit structure data refers to as data representing structures of internal circuits provided within the semiconductor chips A1 and B1 and an external circuit the semiconductor device 100a is to be connected. The inter-circuit connection data refers to as data representing the connection relationship between the internal circuit for the semiconductor chip A1, the internal circuit for the semiconductor chip B1 and the external circuit. The pad position data refers to as data representing the positions of the pads 20 for the semiconductor chip A1, the pads 10 for the semiconductor chip B1 and external pads for the external circuit (leads of lead frame).

Such data are inputted to the input section 71 and then the CPU 72 selects the data and stores the same in the database 73.

Next, in step St2, the CPU 72 searches, on a basis of the respective data, connection paths formed between the pads 10, the pads 20 and the external pads so as to satisfy the inter-circuit connection data.

In step St3, the CPU 72 determines whether or not all of the connection paths obtained by step St2 can be connected by wire bonding. If wire bonding is possible, the CPU 72 activates the wire bond island forming section 80 and the process proceeds to step St4. If at least one of the connection paths obtained in step St2 cannot be connected by wire bonding, the process returns to step St2 and the CPU 72 searches other connection paths that satisfy the inter-circuit connection data. Then, in step St3, it is determined whether or not all of the connection path searched again can be connected by wire bonding. Steps St2 and St3 are repeated until all of connection paths obtained by step St2 can be connected by wire bonding. If all connection paths can be connected by wire bonding, the CPU 72 activates the wire bond island forming section 80 and the process proceed to step St4.

In step St4, the wire bond island forming section 80 calculates the positions on the semiconductor chip B1 that the wire bond islands 31 are formed (wire bond island position data) with respect to connection path connecting the pads 10 to the external pads among the searched connection paths. The wire bond island forming section 80 makes reference to wire bond island configuration data (circular configuration data herein) set as a default stored in advance from the database 73.

In step St5, the CPU 72 produces wire bonding performing data for a wire bonding device to perform wire bonding from the wire bond island position data obtained in step St4 and the wire bond island configuration data.

In step St6, the output section 74 outputs the wire bonding performing data.

By the above-described steps being performed, the semiconductor device 100a is designed.

In accordance with this embodiment, the semiconductor device 100a that bent of wires connecting semiconductor chips is prevented is obtained.

Embodiment 10

Figure 17:
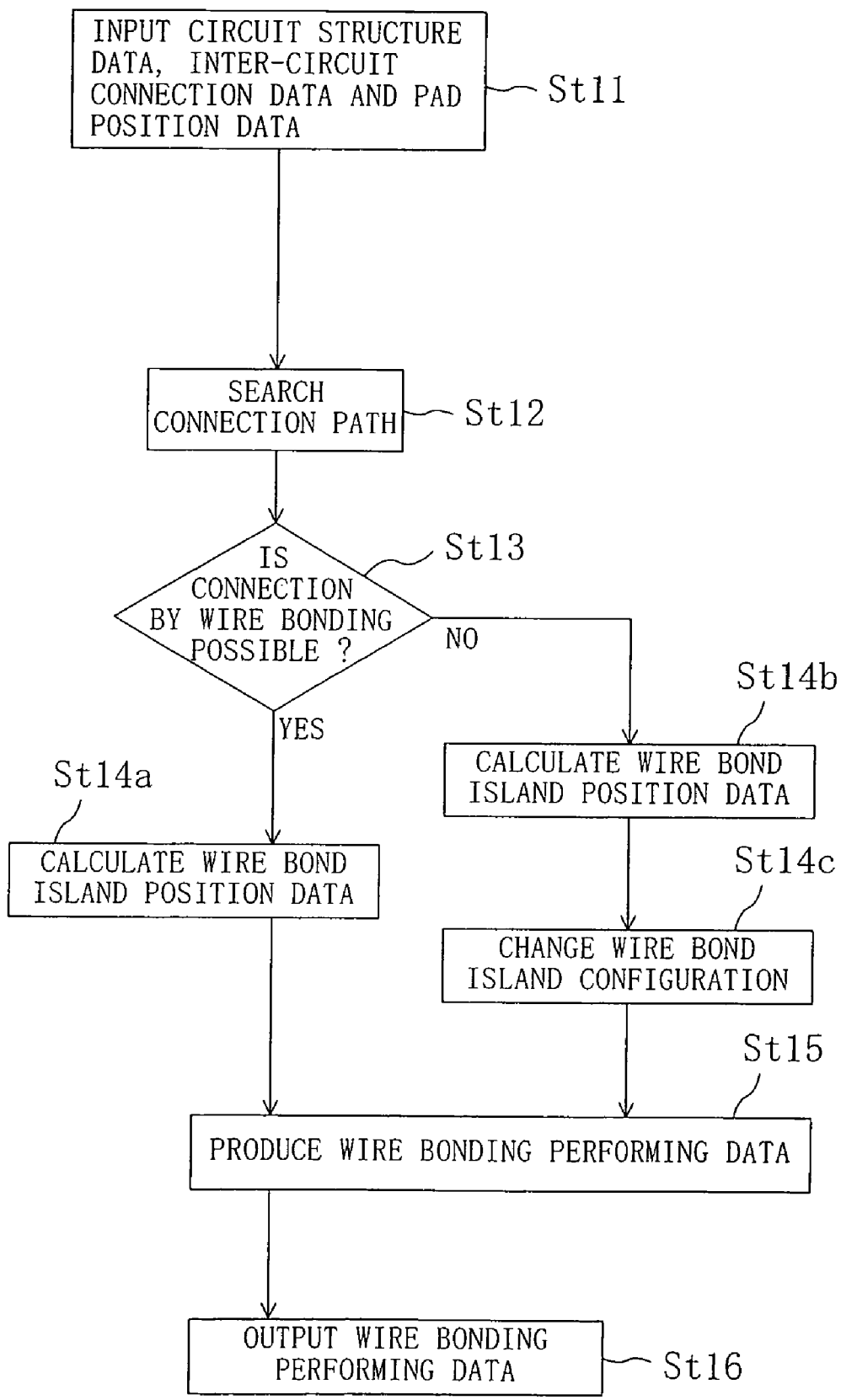
FIG. 17 is a flowchart illustrating operations of the design device in accordance with embodiment 10.

In accordance with this embodiment, a method for designing the semiconductor device 100b of the embodiment 2 will be described. FIG. 17 is a flowchart illustrating operations of the design device 600 when the semiconductor device 100b of the embodiment 2 is designed.

As shown in FIG. 17, firstly in step St11, circuit structure data , data inter-circuit connection and pad position data are inputted to the input section 71.

The circuit structure data refers to data representing structures of the internal circuits provided within the semiconductor chips A2 and B2 and external circuit the semiconductor device 100b is connected. The inter-circuit connection data refers to as data representing the connection relationship between the internal circuit for the semiconductor chip A2, the internal circuit for the semiconductor chip B2 and the internal circuit. The pad position data refers to data representing the positions of the pads 20 for the semiconductor chip A2, the pads 10 for the semiconductor chip B2 and external pads (leads of lead frame) for the external circuit.

When such data are inputted to the input section 71, the CPU 72 selects the data and stores the same in the database 73.

Next, in step St12, the CPU 72 searches, on a basis of the respective data, connection paths formed between the pads 10, the pads 20 and the external pads so as to satisfy the inter-circuit connection data.

The CPU 72 determines in step St13 whether or not all of the connection paths obtained in step St12 can be connected by wire bonding. If connection by wire bonding is possible, the CPU 72 activates the wire bond island forming section 80 and the process proceeds to St14a. If at least one of the connection paths obtained in step St12 cannot be connected by wire bonding, the CPU 72 activates the wire bond island forming section 80 and the process proceeds to step St14b.

In step St14a, the wire bond island forming section 80 calculates the positions on the semiconductor chip B2 that the wire bond islands 31 are to be formed (wire bond island position data) for connection paths connecting the pads 10 to the external pads of the searched connection paths. At this time, the wire bond island forming section 80 makes reference to, from the database 73, wire bond island configuration data (circular configuration data herein) set as a default stored in advance. Then, the process proceeds to step St15.

In step St14b, the wire bond island forming section 80 calculates the positions on the semiconductor chip B2 that the wire bond islands 32 are to be formed (wire bond island position data) for connection paths connecting the pads 10 to the external pads of the searched connection paths. At this time, the wire bond island forming section 80 makes reference to, from the database 73, wire bond island configuration data (circular configuration data herein) set as a default stored in advance. Then, the process proceeds to step St14c.

In step St14c, the wire bond island configuration changing section 81 changes the configuration of the wire bond islands 32 by substituting the wire bond island configuration data (herein by substituting the circular configuration data set as a default by elliptical configuration data ). If a delay value is extremely varied by substitution of the wire bond island configuration data, the wire bond island configuration changing section 81 may optimize materials for the wire bond islands and configurations thereof in order to suppress such variation in the delay value. Then, the process proceeds to step St15.

In step St15, the CPU 72 produces wire bonding performing data for a wire bonding device to perform wire bonding from the wire bond island position data obtained in step St14a and the wire bond island configuration data obtained in step St14c.

In step St16, the output section 74 outputs the wire bonding performing data.

By the above-described steps being performed, the semiconductor device 100b is designed.

In accordance with this embodiment, the semiconductor device 100b that bent of the wires connecting the semiconductor chips is prevented can be obtained. Especially in accordance with this embodiment, by changing the configuration of the wire bond islands, a degree of freedom in wire bonding connection between the semiconductor chips is improved.

Embodiment 11

In accordance with this embodiment, a method for designing the semiconductor device 100b of the embodiment 2 will be described.

Figure 18:
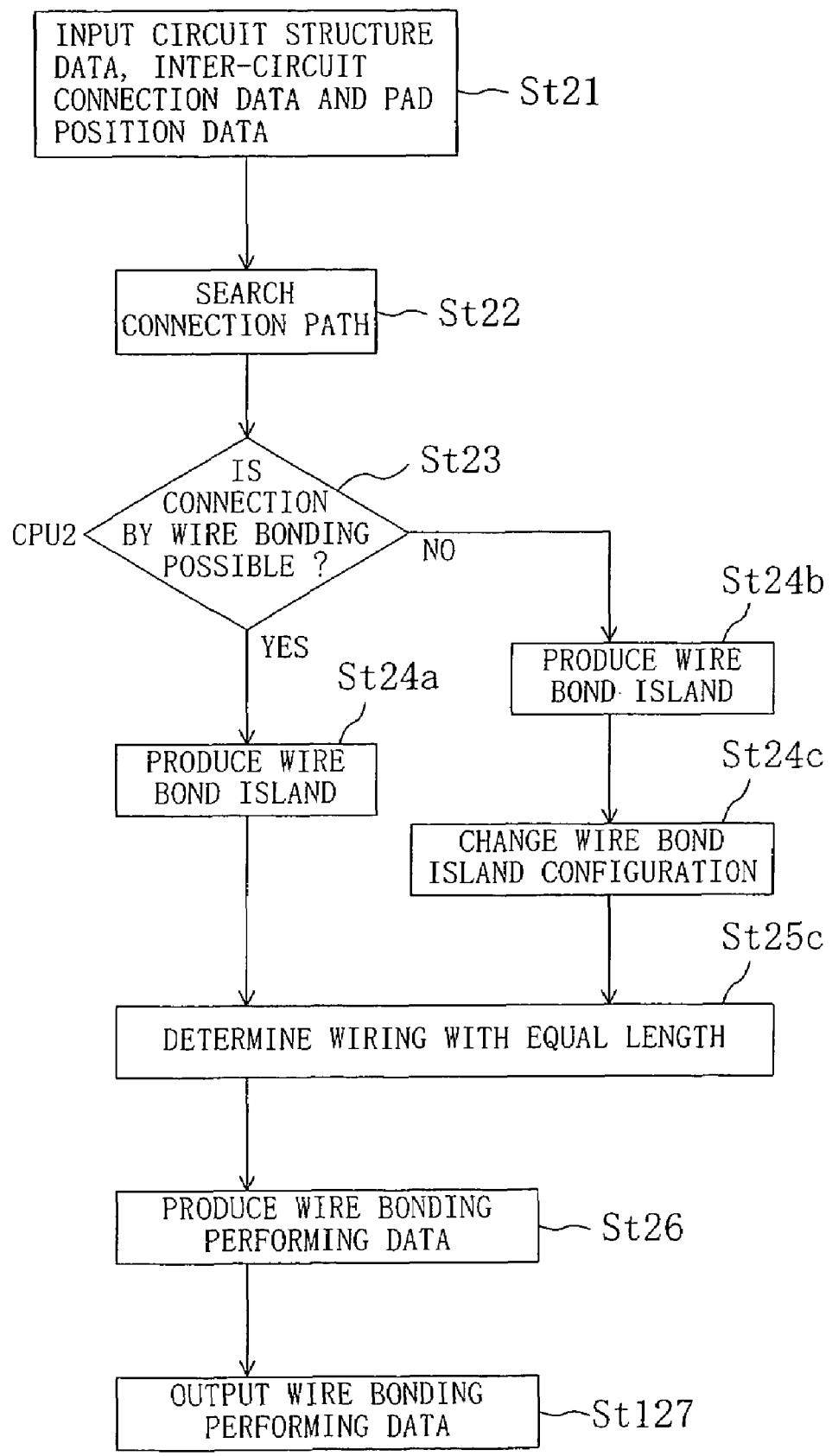
FIG. 18 is a flowchart illustrating operations of the design device in accordance with embodiment 11.

FIG. 18 is a flowchart illustrating operations of a device for designing semiconductor when the semiconductor device 100b of the embodiment 2 is designed.

As shown in FIG. 18, firstly in step St21, circuit structure data, inter-circuit connection data and pad position data are inputted to the input section 71.

The circuit structure data refers to data representing structures of the internal circuits provided within the semiconductor chips A2 and B2 and external circuit the semiconductor device 100b is connected. The inter-circuit connection data refers to as data representing the connection relationship between the internal circuit for the semiconductor chip A2, the internal circuit for the semiconductor chip B2 and the internal circuit. The pad position data refers to data representing the positions of the pads 20 for the semiconductor chip A2, the pads 10 for the semiconductor chip B2 and external pads (leads of lead frame) for the external circuit.

When such data are inputted to the input section 71, the CPU 72 selects the data and stores the same in the database 73.

Next, in step St22, the CPU 72 searches, on a basis of the respective data, connection paths formed between the pads 10, the pads 20 and the external pads so as to satisfy the inter-circuit connection data.

The CPU 72 determines in step St23 whether or not all of the connection paths obtained in step St22 can be connected by wire bonding. If connection by wire bonding is possible, the CPU 72 activates the wire bond island forming section 80 and the process proceeds to St24a. If at least one of the connection paths obtained in step St22 cannot be connected by wire bonding, the CPU 72 activates the wire bond island forming section 80 and the process proceeds to step St24b.

In step St24a, the wire bond island forming section 80 calculates the positions on the semiconductor chip B2 that the wire bond islands 31 are to be formed (wire bond island position data ) for connection paths connecting the pads 10 to the external pads determined in step St23 to be connected by wire bonding. At this time, the wire bond island forming section 80 makes reference to, from the database 73, wire bond island configuration data (circular configuration data herein) set as a default stored in advance. Then, the process proceeds to step St25.

In step St24b, the wire bond island forming section 80 calculates the positions on the semiconductor chip B2 that the wire bond islands 32 are to be formed (wire bond island position data ) for connection paths connecting the pads 10 to the external pads determined in step St23 to be connected by wire bonding. At this time, the wire bond island forming section 80 makes reference to, from the database 73, wire bond island configuration data (circular configuration data herein) set as a default stored in advance. Then, the process proceeds to step St24c.

In step St24c, the wire bond island configuration changing section 81 changes the configuration of the wire bond islands 32 by substituting the wire bond island configuration data (herein by substituting the circular configuration data set as a default by elliptical configuration data ) so that the connection paths connecting the pads 10 to the external pads determined in step St23 not to be connected by wire bonding can be connected and the process proceeds to step St25. If a delay value is extremely varied by substitution of the wire bond island configuration data in this step St24, the wire bond island configuration changing section 81 may optimize materials for the wire bond islands and configurations thereof in order to suppress such variation in the delay value.

Next, in step St25, the CPU 72 activates the equal length path determining section 82. The equal length path determining section 82 determines connection paths that should be have the same length. Specifically, the equal length path determining section 82 selects connection paths that must be have the equal length by making reference to the circuit structure data and the inter-circuit connection data stored in the database 73 in step St21. Then, the equal length path determining section 82 makes reference to the wire bond island position data and the wire bond island configuration data obtained in steps St24a, St24b and St24c and then adjusts the wire bond island position data so that selected connection path have the same length.

In step St26, the CPU 72 produces wire bonding performing data for a wire bonding device to perform wire bonding from the wire bond island position data obtained in step St25 and the wire bond island configuration data obtained in steps St24a and St24c.

In step St27, the output section 74 outputs the wire bonding performing data.

By the above-described steps being performed, the semiconductor device 100b is designed.

In accordance with this embodiment, by adjusting the positions of the wire bond islands 31 and 32, the semiconductor device 100b that specified wires have the same length can be obtained. A skew generated by the difference in length of wires is reduced in the wires with the same length. Thus, the method of this embodiment is especially preferable when synchronous circuits must be structured in the semiconductor device 100b.

In accordance with this embodiment, by adjusting the positions of the wire bond islands 31 and 32, the wires between the semiconductor chip A1 and the semiconductor chip B1 (specifically, the wires 12a, 14a, 17a, 22a and 24a) may have the same length and wire delay values may be also the same value.

Embodiment 12

A method for designing the semiconductor device 100c of the embodiment 3 will be described in this embodiment.

Figure 19:
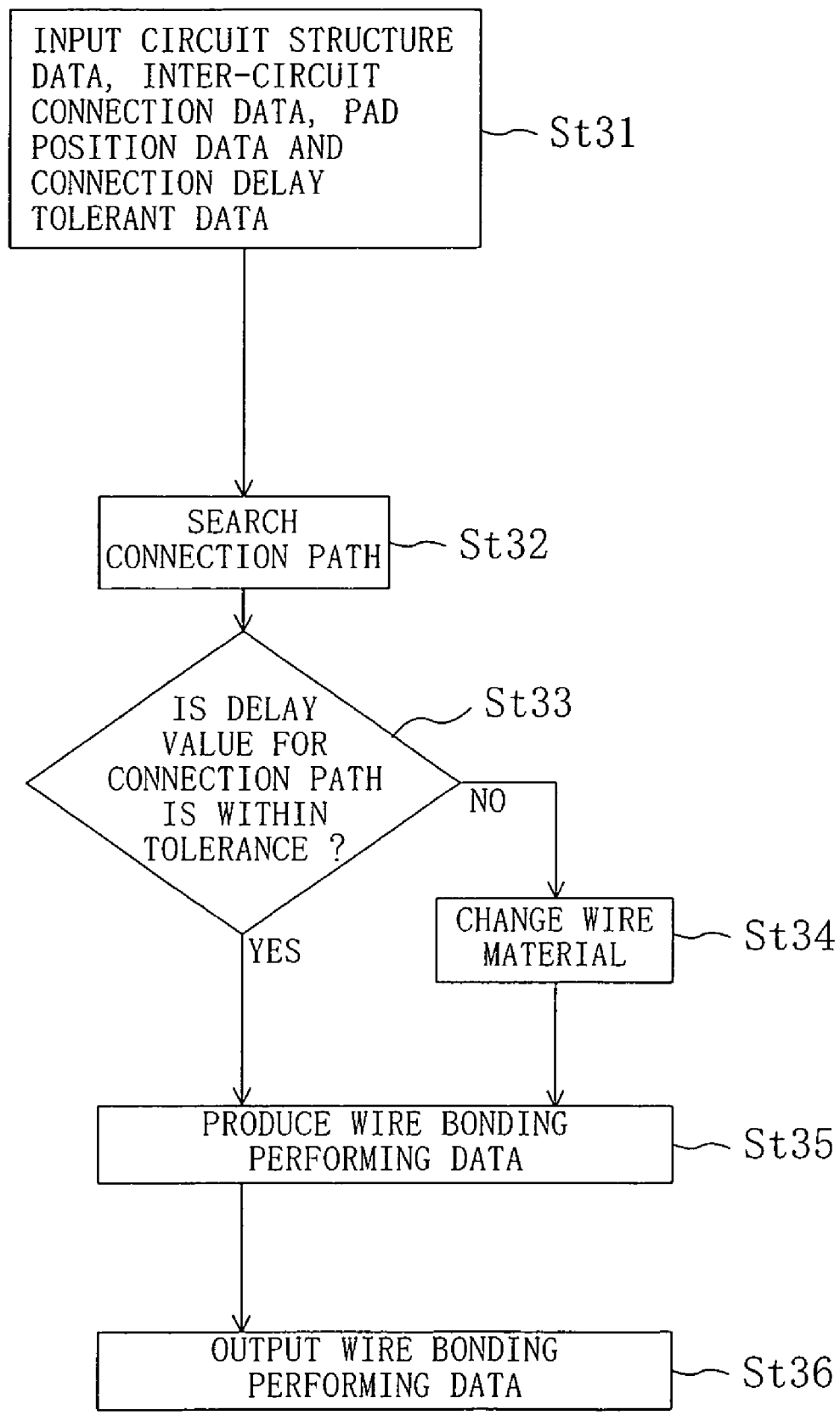
FIG. 19 is a flowchart illustrating operations of the design device in accordance with embodiment 12.

FIG. 19 is a flowchart illustrating operations of the design device 600 when the semiconductor device 100c of the embodiment 3 is designed.

As shown in FIG. 19, firstly in step St31, circuit structure data, inter-circuit connection data, pad position data and connection delay tolerant data are inputted to the input section 71.

The circuit structure data refers to data representing structures of the internal circuits provided within the semiconductor chips A3 and B3 and external circuit the semiconductor device 100c is connected. The inter-circuit connection data refers to as data representing the connection relationship between the internal circuit for the semiconductor chip A3, the internal circuit for the semiconductor chip B3 and the internal circuit. The pad position data refers to data representing the positions of the pads 20 for the semiconductor chip A3, the pads 10 for the semiconductor chip B3 and external pads (leads of lead frame) for the external circuit. The connection delay tolerant data refers to data representing the tolerance of a delay value set for every connection between the internal circuit for the semiconductor chip A3, the internal circuit for the semiconductor chip B3 and the external circuit. The tolerance of the delay value may be set, depending on specifications of semiconductor devices, only for a specified connection or may be set for all connections.

When such data are inputted to the input section 71, the CPU 72 selects the data and stores the same in the database 73.

Next, in step St32, the CPU 72 searches, on a basis of the respective data, connection paths formed between the pads 10, the pads 20 and the external pads so as to satisfy the inter-circuit connection data.

In step St33, the CPU 72 activates the delay determining section 83. The delay determining section 83 calculates, on a basis of data about resistance values for wire materials stored in the database 73 serving as a default, a delay value for connection paths obtained in step St32 and then determines whether or not the calculated delay value is within a tolerance on a basis of the connection delay tolerant data. If the calculated delay value is within a tolerance, the CPU 72 proceeds to step St35. If the delay value calculated in the connection paths obtained in step St32 is out of tolerance, the CPU 72 activates the wire material changing section 84 and the process proceeds to step St34.

In step St34, the wire material changing section 84 changes materials for wires for connection paths that the delay value obtained in step St33 is out of tolerance. Specifically, the wire material changing section 84 selects materials for wires that a delay value is within a tolerance while making reference to data about resistance for various materials stored in advance in the database 73. Then, the process proceeds to step St35.

In step St35, the CPU 72 produces, on a basis of the connection paths obtained in step St33, wire bonding performing data for a wire bonding device to perform wire bonding. If the connection paths that wire materials were changed in step St34 are provided, wire bonding performing data is produced on a basis of obtained materials for wires.

Next, in step St36, the output section 74 outputs the wire bonding performing data.

By the above-described steps being performed, the semiconductor device 100c is designed.

In accordance with this embodiment, wire materials may be changed. For this reason, a delay value may be adjusted for each of the connection paths between the semiconductor chips.

Especially by changing to wire materials with low resistance, in accordance with this embodiment, a semiconductor device in which a wiring resistance between semiconductor chips is reduced and which is capable of operating at high speed can be obtained.

Embodiment 13

A method for designing the semiconductor device 100d of the embodiment 4 will be described in this embodiment.

Figure 20:
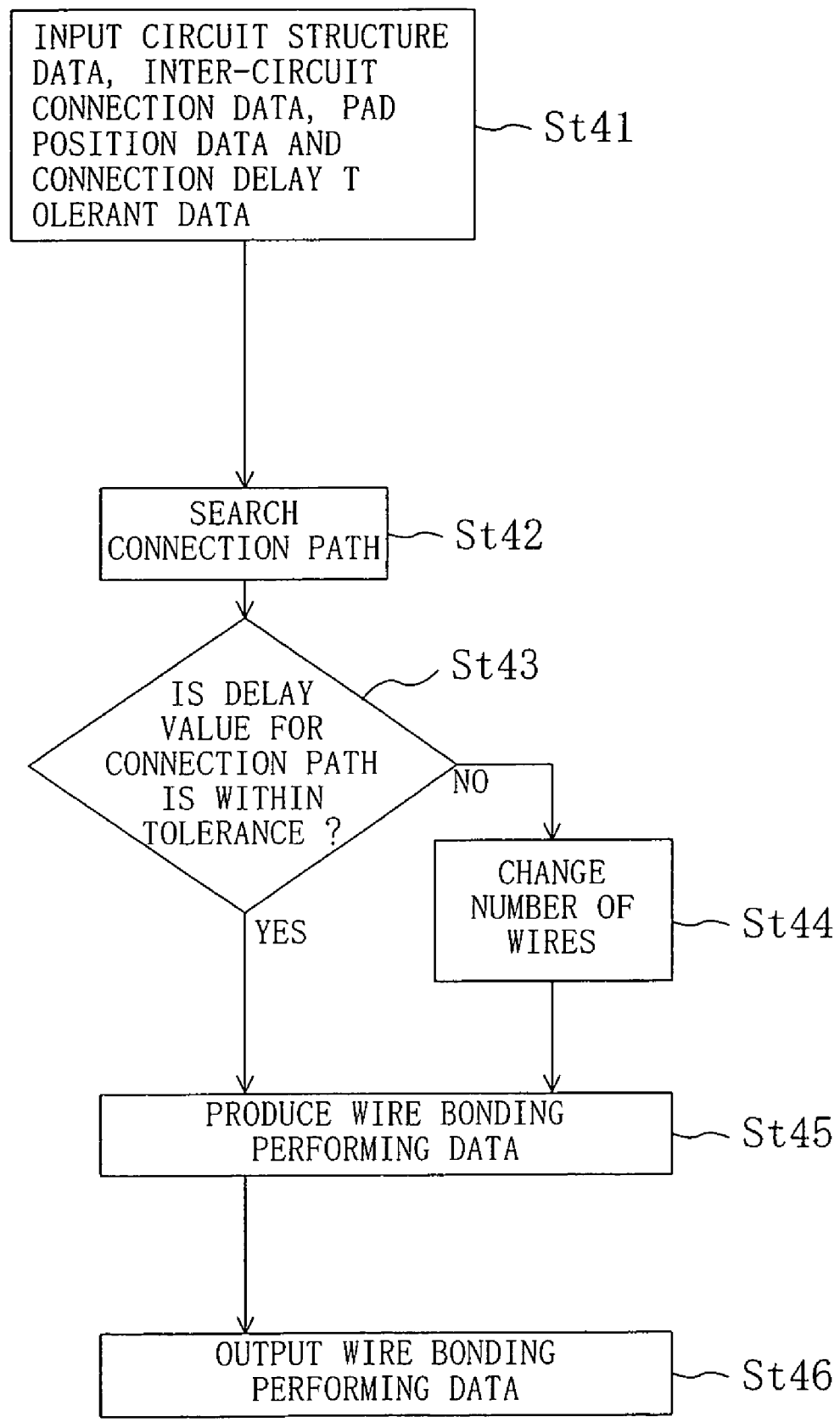
FIG. 20 is a flowchart illustrating operations of the design device in accordance with embodiment 13.

FIG. 20 is a flowchart illustrating operations of a device for designing semiconductor when the semiconductor device 100d of the embodiment 4 is designed.

As shown in FIG. 20, firstly in step St41, circuit structure data, inter-circuit connection data, pad position data and connection delay tolerant data are inputted to the input section 71.

The circuit structure data refers to data representing structures of the internal circuits provided within the semiconductor chips A4 and B4 and external circuit the semiconductor device 100d is connected. The inter-circuit connection data refers to as data representing the connection relationship between the internal circuit for the semiconductor chip A4, the internal circuit for the semiconductor chip B4 and the internal circuit. The pad position data refers to data representing the positions of the pads 20 for the semiconductor chip A4, the pads 10 for the semiconductor chip B4 and external pads (leads of lead frame) for the external circuit. The connection delay tolerant data refers to data representing the tolerance of a delay value set for every connection between the internal circuit for the semiconductor chip A4, the internal circuit for the semiconductor chip B4 and the external circuit. The tolerance of the delay value may be set, depending on specifications of semiconductor devices, only for a specified connection or may be set for all connections.

When such data are inputted to the input section 71, the CPU 72 selects the data and stores the same in the database 73.

Next, in step St42, the CPU 72 searches, on a basis of the respective data, connection paths formed between the pads 10, the pads 20 and the external pads so as to satisfy the inter-circuit connection data.

In step St43, the CPU 72 calculates, on a basis of data about resistance values for wire materials stored in the database 73 serving as a default, a delay value for connection paths obtained in step St42 and then determines whether or not the calculated delay value is within a tolerance on a basis of the connection delay tolerant data. If the calculated delay value is within a tolerance, the CPU 72 proceeds to step St45. If the delay value calculated in the connection paths obtained in step St42 is out of tolerance, the CPU 72 activates the number-of-wires changing section 85 and the process proceeds to step St44.

In step St44, the number-of-wires changing section 85 changes the number of wires for the connection paths that the delay value obtained in step St43 is out of tolerance. Specifically, the number-of-wires changing section 85 makes reference to data about resistance values for wire materials stored as a default in advance in the database 73 and then selects the number of wires that a delay value is within the tolerance. Then, the process proceeds to step St45.

In step St45, the CPU 72 produces, on a basis of the connection paths obtained in step St43, wire bonding performing data for a wire bonding device to perform wire bonding. If there may be included connection paths with the number of wires having been changed in step St44, wire bonding performing data is produced on a basis of the obtained number of wires.

Next, in step St46, the output section 74 outputs the wire bonding performing data.

By the above-described steps being performed, the semiconductor device 100d is designed.

In accordance with this embodiment, a delay value may be adjusted for each of the connection paths between the semiconductor chips by changing the number of wires.

Especially by increasing the number of wires, in accordance with this embodiment, a semiconductor device which has reduced wiring resistance between semiconductor chips and is capable of operating at high speed can be obtained.

Embodiment 14

Figure 21:
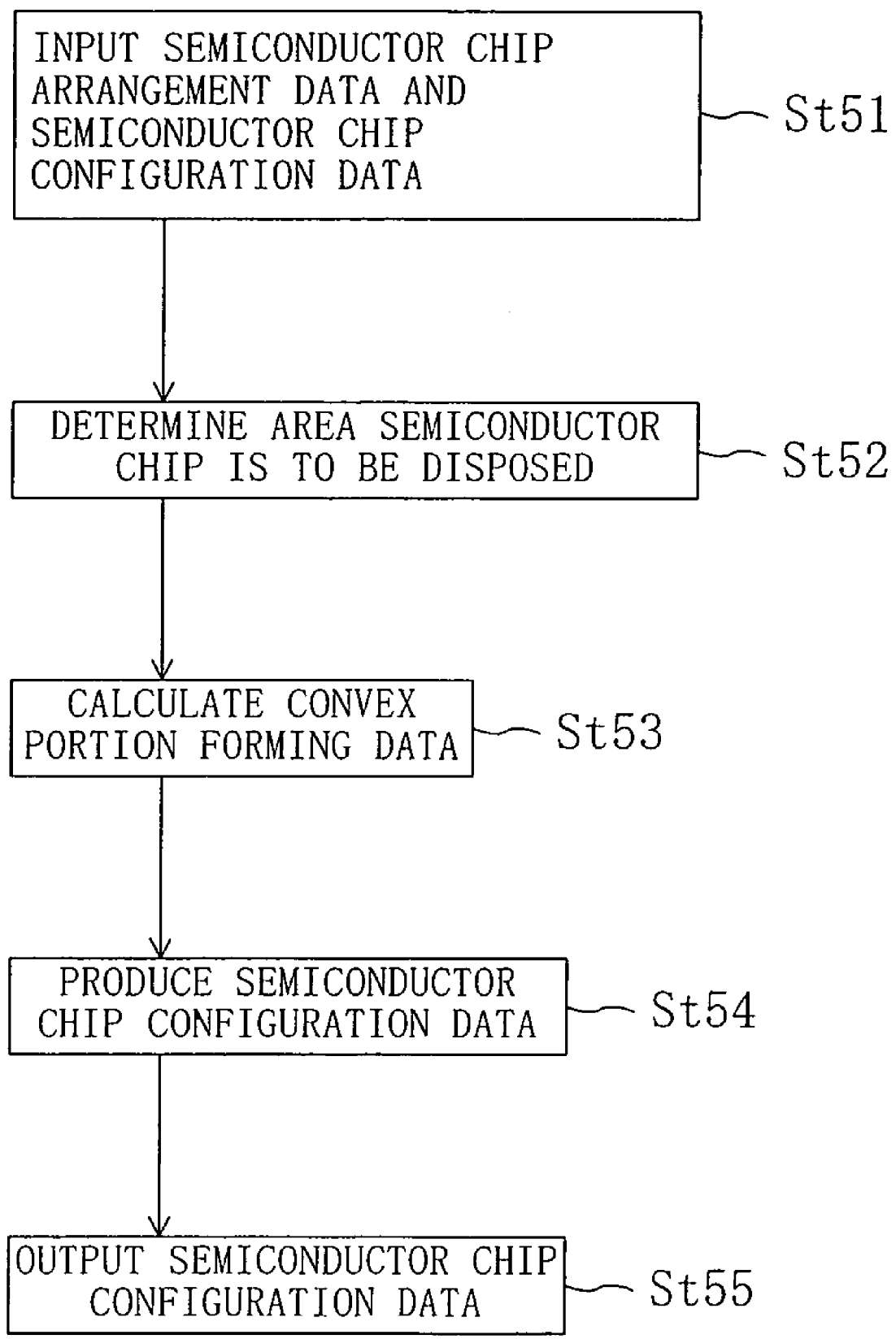
FIG. 21 is a flowchart illustrating operations of the design device in accordance with embodiment 14.

This embodiment will describe a method for designing the semiconductor device 200 of the embodiment 5. In accordance with this embodiment, the convex portions 40 for sliding are not formed. FIG. 21 shows a flowchart illustrating operations of the design device 600 when the semiconductor device 200 of the embodiment 5 without the convex portions 40 for sliding being provided thereat is designed.

As shown in FIG. 21, firstly in step St51, semiconductor chip arrangement data and semiconductor chip configuration data are inputted to the input section 71.

The semiconductor chip arrangement data refers to data representing an arrangement relationship when the semiconductor chip A5 is adhered on the semiconductor chip B5. The semiconductor chip configuration data refers to data representing configurations of the semiconductor chips A5 and B5.

When the respective data are inputted to the input section 71, the CPU 72 selects the data and stores the same in the database 73.

Next, in step St52, the CPU 72 determines, from the respective data, the area on the semiconductor chip B5 that the semiconductor chip A5 is to be disposed.

In step St53, the CPU 72 activates the convex portion forming section 86. The convex portion forming section 86 calculates convex portion forming data (coordinates and configurations) for forming the convex portions 41 confining the area that the semiconductor chip A5 is to be disposed obtained in step St52 on the upper surface of the semiconductor chip B2. Specifically, the convex portion forming section 86 makes reference to various convex portion forming data already stored in the database 73 and selects optimum convex portion forming data.

In step St54, the CPU 72 produces, on a basis of the convex portion forming data obtained in step St53, semiconductor chip configuration data representing the configuration of the semiconductor chip B5.

In step St55, the output section 74 outputs the semiconductor chip configuration data.

By the above-described steps being performed, the semiconductor device 200 is designed.

In accordance with this embodiment, the convex portions 41 for confining the area that the semiconductor chip A5 is to be adhered are designed on the upper surface of the semiconductor chip B5. Thus, when the two semiconductor chips are adhered with each other in a process for manufacturing a semiconductor device, the semiconductor chip A5 is securely fixed on the semiconductor chip B5 without misalignment.

Namely, by confining the configuration of an area semiconductor chips are junctioned, semiconductor devices can be easily adhered with each other.

Embodiment 15

Figure 22:
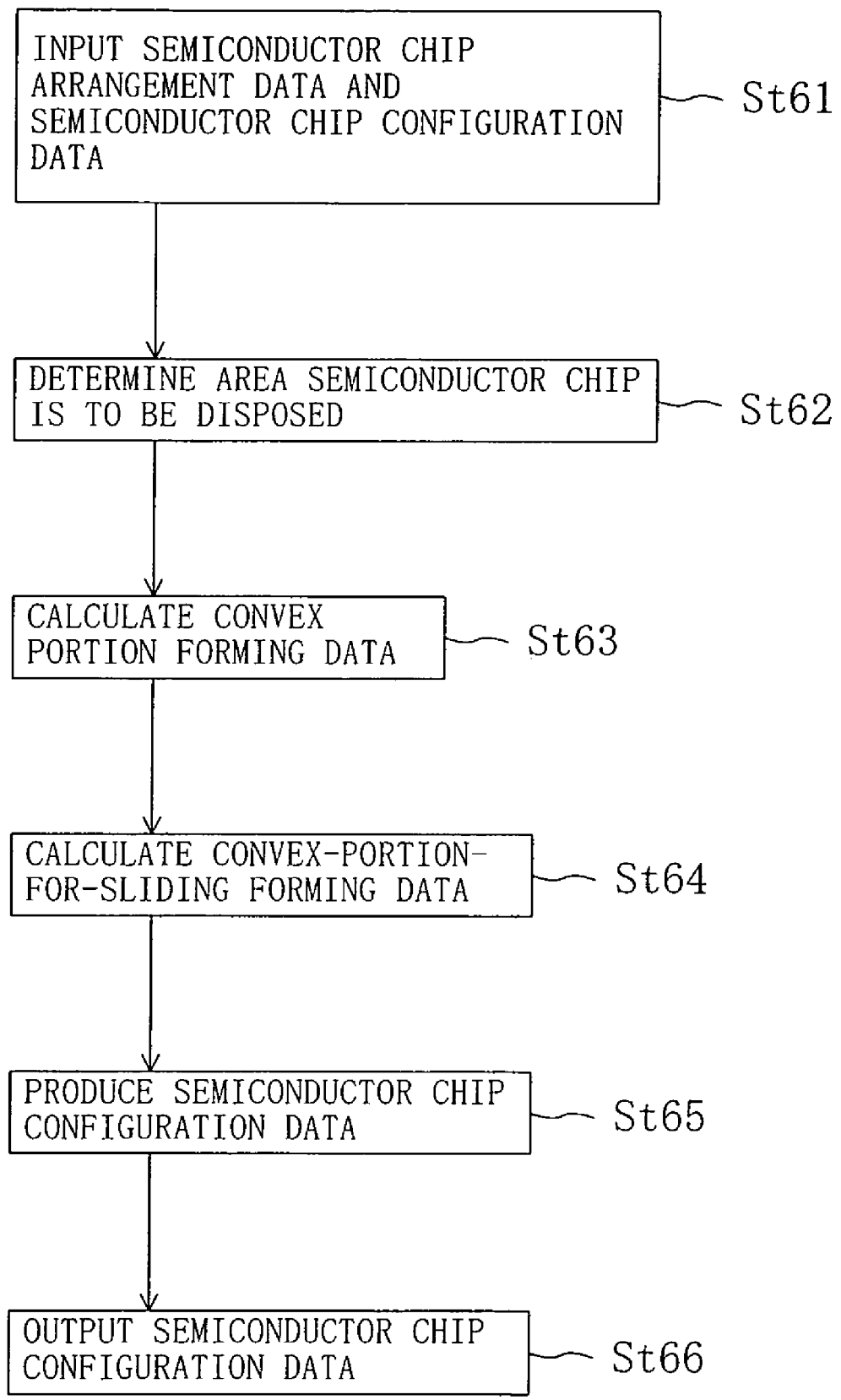
FIG. 22 is a flowchart illustrating operations of the design device in accordance with embodiment 15.

This embodiment will describe a method for designing the semiconductor device 200 of the embodiment 5. FIG. 22 shows a flowchart illustrating operations of the design device 600 when the semiconductor device 200 of the embodiment 5 is designed.

As shown in FIG. 22, firstly in step St61, semiconductor chip arrangement data and semiconductor chip configuration data are inputted to the input section 71.

The semiconductor chip arrangement data refers to data representing an arrangement relationship when the semiconductor chip A5 is adhered on the semiconductor chip B5. The semiconductor chip configuration data refers to data representing configurations of the semiconductor chips A5 and B5.

When the respective data are inputted to the input section 71, the CPU 72 selects the data and stores the same in the database 73.

Next, in step St62, the CPU 72 determines, from the respective data, the areas that the semiconductor chip A5 the semiconductor chip B5 are to be disposed.

In step St63, the CPU 72 activates the convex portion forming section 86. The convex portion forming section 86 calculates convex portion forming data (coordinates and configurations) for forming the convex portions 41 confining the area that the semiconductor chip A5 is to be disposed obtained in step St62. Specifically, the convex portion forming section 86 makes reference to various convex portion forming data already stored in the database 73 and selects optimum convex portion forming data.

In step St64, the CPU 72 activates the convex-portion-for-sliding forming section 87. The convex-portion-for-sliding forming section 87 calculates convex-portion-for-sliding forming data (coordinates and configurations) for forming the convex portion 40 for sliding at areas other than the area obtained in step St62 that the semiconductor chip A5 is to be disposed. The convex portions 40 for sliding are formed so that an area with sufficient size and configuration for the semiconductor chip A5 to be adhered is not formed. Specifically, the convex-portion-for-sliding forming section 87 makes reference to various convex-portion-for-sliding forming data already stored in the database 73 and then selects optimum convex-portion-for-sliding forming data.

In step St65, the CPU 72 produces, on a basis of the convex portion forming data and the convex-portion-for-sliding forming data, semiconductor chip configuration data representing the configuration of the semiconductor chip B5.

In step St66, the output section 74 outputs the semiconductor chip configuration data.

By the above-described steps being performed, the semiconductor device 200 is designed.

In accordance with this embodiment, the convex portions 40 for sliding disposed so that an area with sufficient size and configuration for the semiconductor chip A5 to be adhered is not formed are designed on the upper surface of the semiconductor chip B5. Thus, even if the semiconductor chip A5 is disposed at positions other than the area that the semiconductor chip A5 should be originally disposed when being adhered on the semiconductor chip B5 in a process for manufacturing the semiconductor device 200, the semiconductor chip A5 slides on the convex portions 40 for sliding and then is reliably adhered at the area confined by the convex portions 41.

Namely, when the semiconductor chip A5 is adhered on the semiconductor chip B5, their alignment needs not to be performed. Accordingly, in accordance with this embodiment, the semiconductor chip A5 can be easily adhered on the semiconductor chip B5.

Embodiment 16

Figure 23:
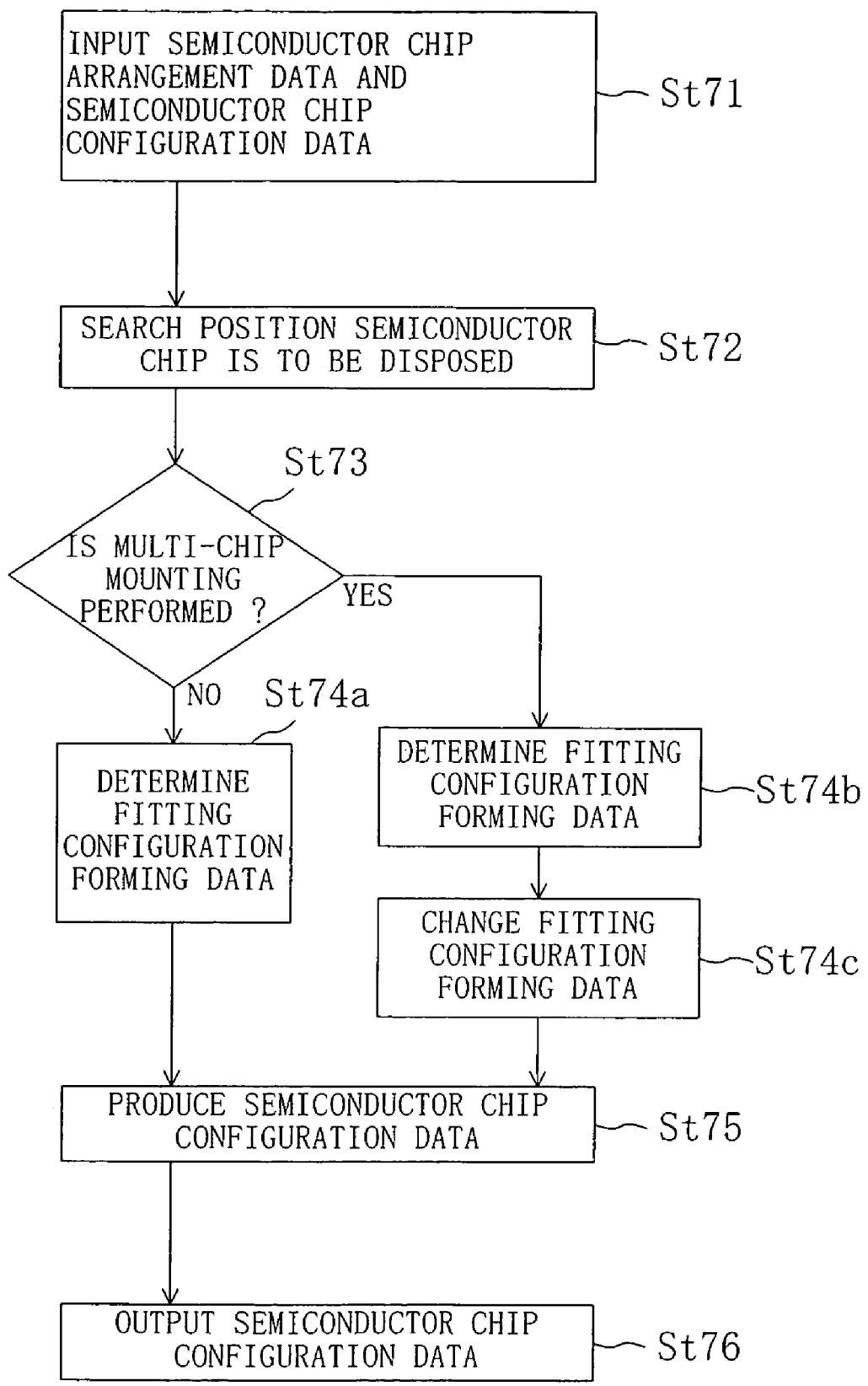
FIG. 23 is a flowchart illustrating operations of the design device in accordance with embodiment 16.

This embodiment will describe a method for designing the semiconductor device 300 of the embodiment 6. Here, in accordance with this embodiment, the marks 44a and 44b for chip arrangement are not formed. FIG. 23 is a flowchart illustrating operations of the design device 600 when the semiconductor device 300 of the embodiment 6 without the marks 44a and 44b for chip arrangement being provided thereat is designed.

FIG. 23 is a flowchart illustrating operations of the design device 600 when the semiconductor device 300 of the embodiment 6 is designed.

As shown in FIG. 23, firstly in step St71, semiconductor chip arrangement data and semiconductor chip configuration data are inputted to the input section 71.

The semiconductor chip arrangement data refers to data representing an arrangement relationship when the semiconductor chips A6 and A6' are adhered on the semiconductor chip B6. The semiconductor chip configuration data refers to data representing the configurations of the semiconductor chips A6, A6' and B6.

When the respective data are inputted to the input section 71, the CPU 72 selects the data and stores the same in the database 73.

In step St72, the CPU 72 searches, from the respective data, the positions that the semiconductor chips A6, B6 and C6 are to be disposed.

In step St73, it is determined whether or not a plurality of semiconductor chips are to be mounted on a semiconductor chip (multi-chip mounting). In a case of the multi-chip mounting as in this embodiment, the process proceeds to step St74b. Otherwise, the step proceeds to step St74a.

In step St74a, the CPU 72 activates the fitting configuration forming section 88. The fitting configuration forming section 88 determines fitting configuration forming data (coordinates and configurations) used for forming configurations fitting with each other (e.g., the convex portion 43a and the opening 42a shown in FIG. 8) at two semiconductor chips when the two semiconductor chips are to be adhered with each other. At this time, the fitting configuration forming section 88 makes reference to fitting configuration forming data (in this embodiment, cylindrical convex portion and cylindrical opening) already stored as a default in the database 73. Then, the process proceeds to step St75.

In step St74b, the CPU 72 activates the fitting configuration forming section 88. The fitting configuration forming section 88 calculates fitting configuration data (coordinates and configurations) used for forming configurations fitting with each other (the convex portion 43a and the opening 42a, and the convex portion 43b and the opening 42b) on the semiconductor chips when the semiconductor chips are adhered with each other. At this time, the fitting configuration forming section 88 makes reference to fitting configuration forming data already stored as a default in the database 73 (in this embodiment, the cylindrical convex portion 43a and 43b, and the cylindrical convex portion and the opening portion 42a and 42b). Then, the process proceeds to step St74c.

In step St74c, the CPU 72 activates the fitting configuration changing section 89. The fitting configuration changing section 89 changes the fitting configuration forming data obtained in step St74b so that mounted semiconductor chips have different configurations. In accordance with this embodiment, the configuration of fitted portions of the semiconductor chips A6 and B6 (cylindrical configuration) is different from that of fitted portions of the semiconductor chips A6' and B6 (square pole configuration).

In step St75, the CPU 72 produces, on a basis of the fitting configuration forming data, semiconductor chip configuration data representing the configurations of semiconductor chips (in this embodiment, the semiconductor chips A6, A6' and B6).

In step St76, the output section 74 outputs the semiconductor chip configuration data.

By the above-described steps being performed, the semiconductor device 300 is designed.

In accordance with this embodiment, the convex portions 43a are designed on the semiconductor chip A6, the convex portions 43b are designed on the semiconductor chip A6' and the openings 42a and 42b are designed on the semiconductor chip B6 such that when the semiconductor chips A6 and A6' are adhered on the semiconductor chip B6, the convex portions 43a are fitted into the openings 42a and the convex portions 43b are fitted into the opening portions 42b. Thus, the semiconductor chip A6 is securely fixed without misalignment when being adhered on the semiconductor chip B6 together with the semiconductor chip A6' in a process for manufacturing the semiconductor device 300.

Further, in accordance with this embodiment, the convex portions 43a and the opening portions 42a are designed in a cylindrical configuration. The convex portions 43b and the opening portions 42b are designed in a square pole configuration. Thus, if the semiconductor chip A6 is mistaken for the semiconductor chip A6', the semiconductor chips A6 and A6' cannot be adhered on the semiconductor chip B6. Accordingly, it is possible to prevent a semiconductor device from being structured with the semiconductor chip A6 being mistaken for the semiconductor chip A6'. Namely, when the semiconductor device has a multi-chip structure, a semiconductor device that mistakes of adhering semiconductor chips can be prevented can be designed.

Although the convex portions 43a and the opening portions 42a are formed in a cylindrical configuration and the convex portion 43b and the opening portions 42b are formed in a square pole configuration in this embodiment, the present invention is not limited to such case. For example, the convex portions 43a and the opening portions 42a may have any configurations including a star-shaped configuration and a triangular pole configuration.

Embodiment 17

Figure 24:
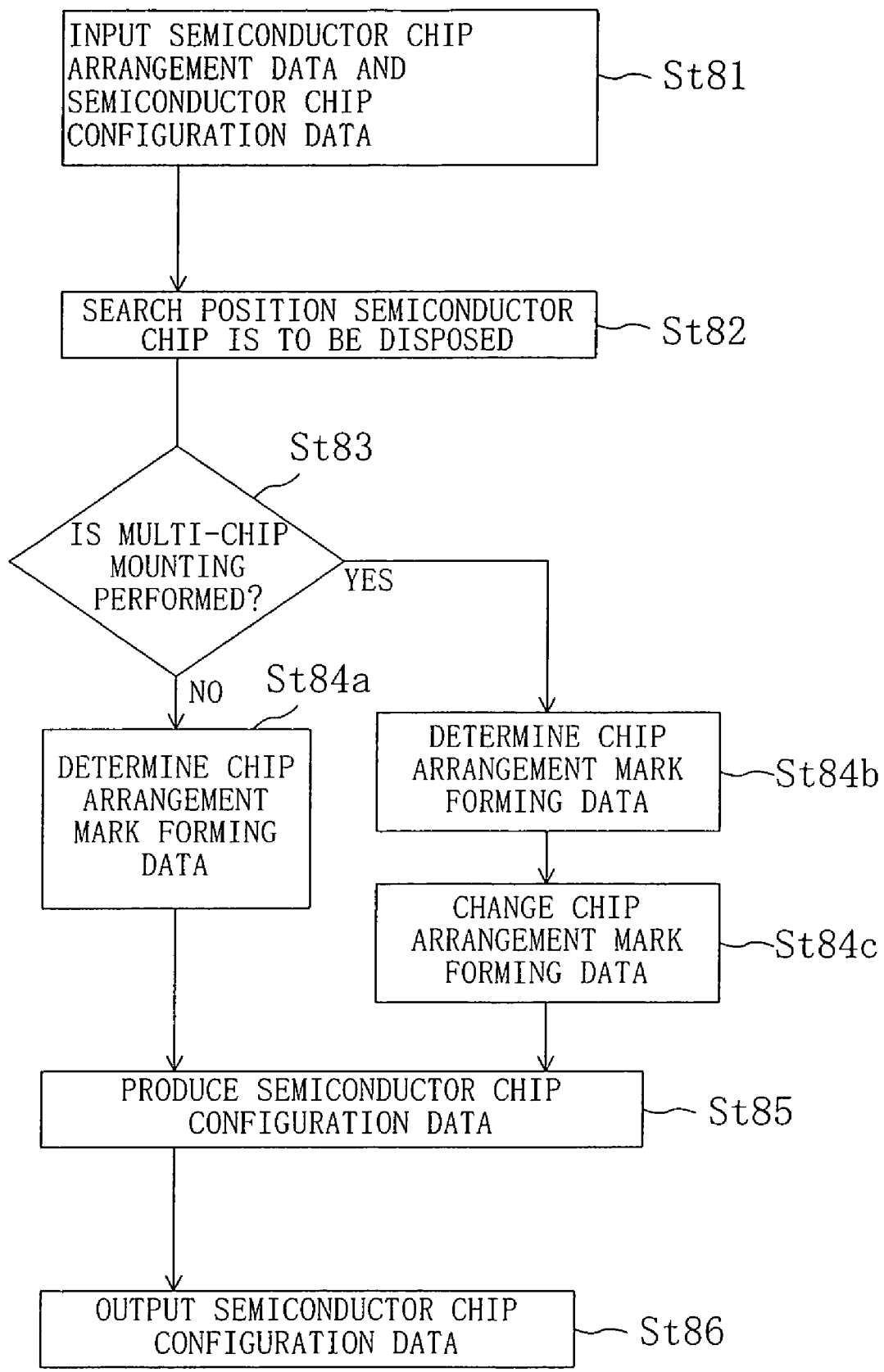
FIG. 24 is a flowchart illustrating operations of the design device in accordance with embodiment 17.

This embodiment will describe a method for designing the semiconductor device 300 of the embodiment 6. Here, in accordance with this embodiment, the convex portions 43a and 43b, and the opening portions 42a and 42b are not formed. FIG. 24 is a flowchart illustrating operations of the design device 600 when the semiconductor device 300 of the embodiment 6 without the convex portions 43a and 43b and the opening portions 42a and 42b being provided thereat is designed.

FIG. 24 is a flowchart illustrating operations of the design device 600 when the semiconductor device 300 of the embodiment 6 is designed.

As shown in FIG. 24, firstly in step St81, semiconductor chip arrangement data and semiconductor chip configuration data are inputted to the input section 71.

The semiconductor chip arrangement data refers to data representing an arrangement relationship when the semiconductor chips A6 and A6' are adhered on the semiconductor chip B6. The semiconductor chip configuration data refers to data representing the configurations of the semiconductor chips A6, A6' and B6.

When the respective data are inputted to the input section 71, the CPU 72 selects the data and stores the same in the database 73.

In step St82, the CPU 72 searches, from the respective data, the positions that the semiconductor chips A6, B6 and C6 are to be disposed.

In step St83, it is determined whether or not a plurality of semiconductor chips are to be mounted on a semiconductor chip (multi-chip mounting). In a case of the multi-chip mounting as in this embodiment, the process proceeds to step St84b. Otherwise, the step proceeds to step St84a.

In step St84a, the CPU 72 activates the chip arrangement mark forming section 90. The chip arrangement mark forming section 90 determines chip arrangement mark forming data (coordinates and configurations) used for forming chip arrangement marks (e.g., the chip arrangement mark 44a shown in FIG. 8 and the like) serving as a mark used when two semiconductor chips are to be adhered with each other. At this time, the chip arrangement mark forming section 90 makes reference to chip arrangement mark forming data (in this embodiment, characters such as L and R) already stored as a default in the database 73. Then, the process proceeds to step St85.

In step St84b, the CPU 72 activates the chip arrangement mark forming section 90. The chip arrangement mark forming section 90 determines chip arrangement mark forming data (coordinates and configurations) used for forming the chip arrangement marks 44a and 44b serving as a mark utilized when semiconductor chips are adhered with each other on the semiconductor chips when the semiconductor chips are adhered with each other. At this time, the chip arrangement mark forming section 90 makes reference to the chip arrangement mark forming data already stored as a default in the database 73 (in this embodiment, characters such as L and R). Then, the process proceeds to step St85.

In step St84c, the CPU 72 activates the chip arrangement mark changing section 91. The chip arrangement mark changing section 91 changes the chip arrangement mark forming data obtained in step St84b so that chip arrangement marks are different for each mounted semiconductor chip. In accordance with this embodiment, the mark on the semiconductor chips A6 and B6 ("L" of the chip arrangement mark 44a) is different from that on the semiconductor chips A6' and B6 ("R" of the chip arrangement mark 44b).

In step St85, the CPU 72 produces, on a basis of the chip arrangement mark forming data, semiconductor chip configuration data representing the configurations of semiconductor chips (in this embodiment, the semiconductor chips A6, A6' and B6).

In step St86, the output section 74 outputs the semiconductor chip configuration data.

By the above-described steps being performed, the semiconductor device 300 is designed.

In accordance with this embodiment, the chip arrangement mark 44a for disposing the semiconductor chip A6 is designed at the area on the semiconductor chip B6 that the semiconductor chip A6 is to be adhered. Similarly, the chip arrangement mark 44b for disposing the semiconductor chip A6' is designed at the area on the semiconductor chip B6 that the semiconductor chip A6' is to be adhered. Thus, the semiconductor chip A6 is seldom mistaken for the semiconductor chip A6' when being adhered on the semiconductor chip B6 together with the semiconductor chip A6' in a process for manufacturing the semiconductor device 300.

Embodiment 18

Figure 25:
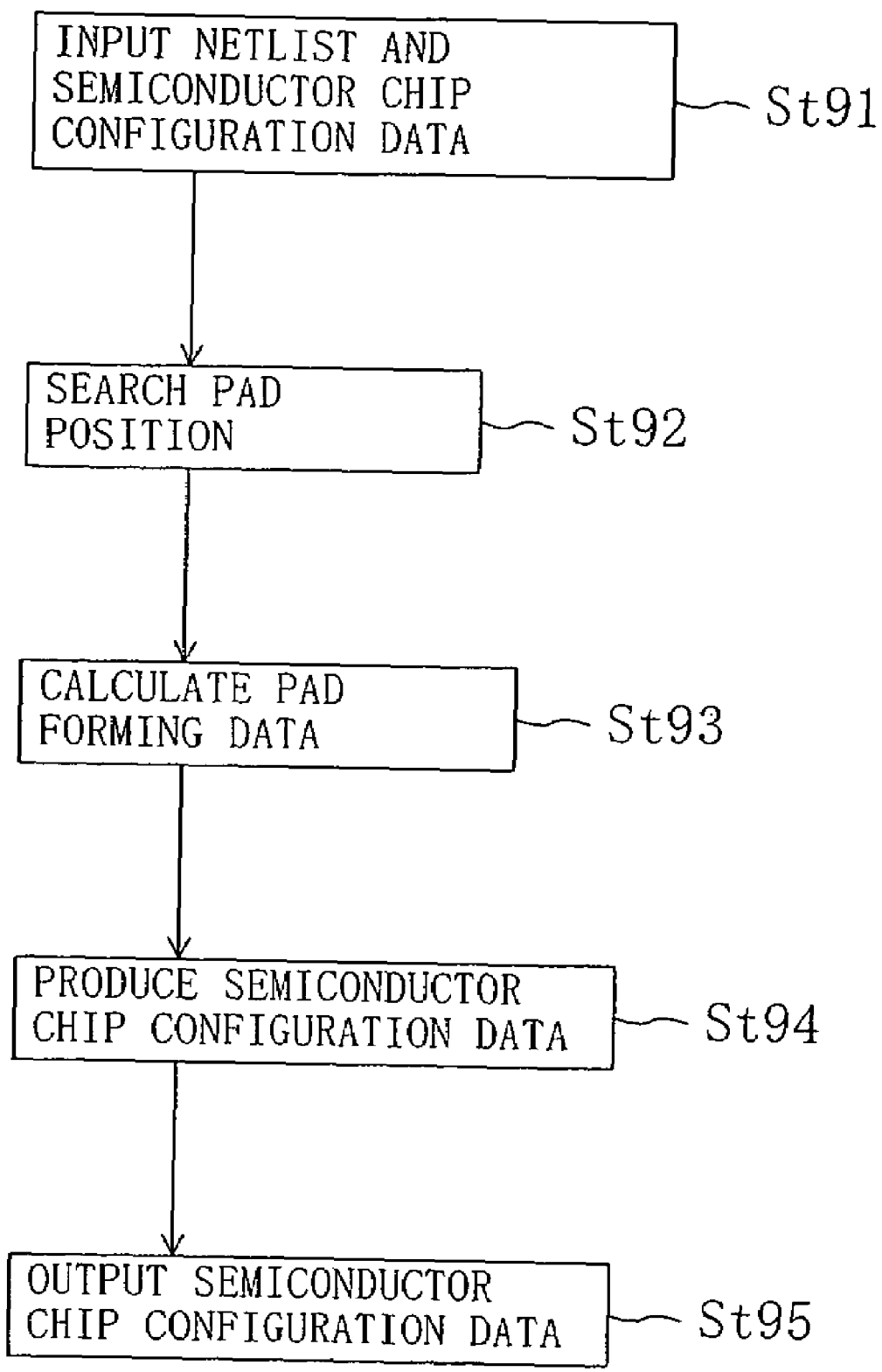
FIG. 25 is a flowchart illustrating operations of the design device in accordance with embodiment 18.

This embodiment will describe a method for designing the semiconductor chip A7 for structuring the semiconductor devices 400 and 400' of the embodiment 7. FIG. 25 is a flowchart illustrating operations of the design device 600 when the semiconductor chip A7 of the embodiment 7 is designed.

FIG. 25 is a flowchart illustrating operations of the design device 600 when the semiconductor chip A7 of the embodiment 7 is designed.

As shown in FIG. 25, firstly in step St91, a netlist for the internal circuit of the semiconductor chip A7 and data of the configuration of the semiconductor chip A7 are inputted to the input section 71. When the respective data are inputted to the input section 71, the CPU 72 selects the data and stores the same in the database 73.

In step St92, the CPU 72 determines, from the respective data, the positions on the semiconductor chip A7 that the wire bonding pads 20 and the bump connection pads 30 connected in parallel to the internal circuit are disposed.

In step St93, the CPU 72 activates the pad forming section 92. The pad forming section 92 calculates pad forming data on a basis of the positions of the pads obtained in step St92 and the pad configuration data stored in advance in the database 73.

In step St94, the CPU 72 produces, on a basis of the pad forming data, semiconductor chip configuration data representing the configuration of the semiconductor chip A7.

In step St95, the output section 74 outputs the semiconductor chip configuration data.

By the above-described steps being performed, the semiconductor chip A7 is designed.

In accordance with this embodiment, the semiconductor chip A7 that comprises the wire bonding pads 20 and the bump connection pads 30 connected in parallel to the internal circuit is designed. Accordingly, wiring for the semiconductor chip A7 is possible by either wire bonding or bump connection.

Thus, an optimum connection method for structuring a semiconductor device can be selected depending on sizes of semiconductor chip to be adhered to the semiconductor chip A7 and wiring rules. Namely, a degree of freedom in designing a semiconductor chip and a semiconductor device is extremely improved.

Embodiment 19

Figure 26:
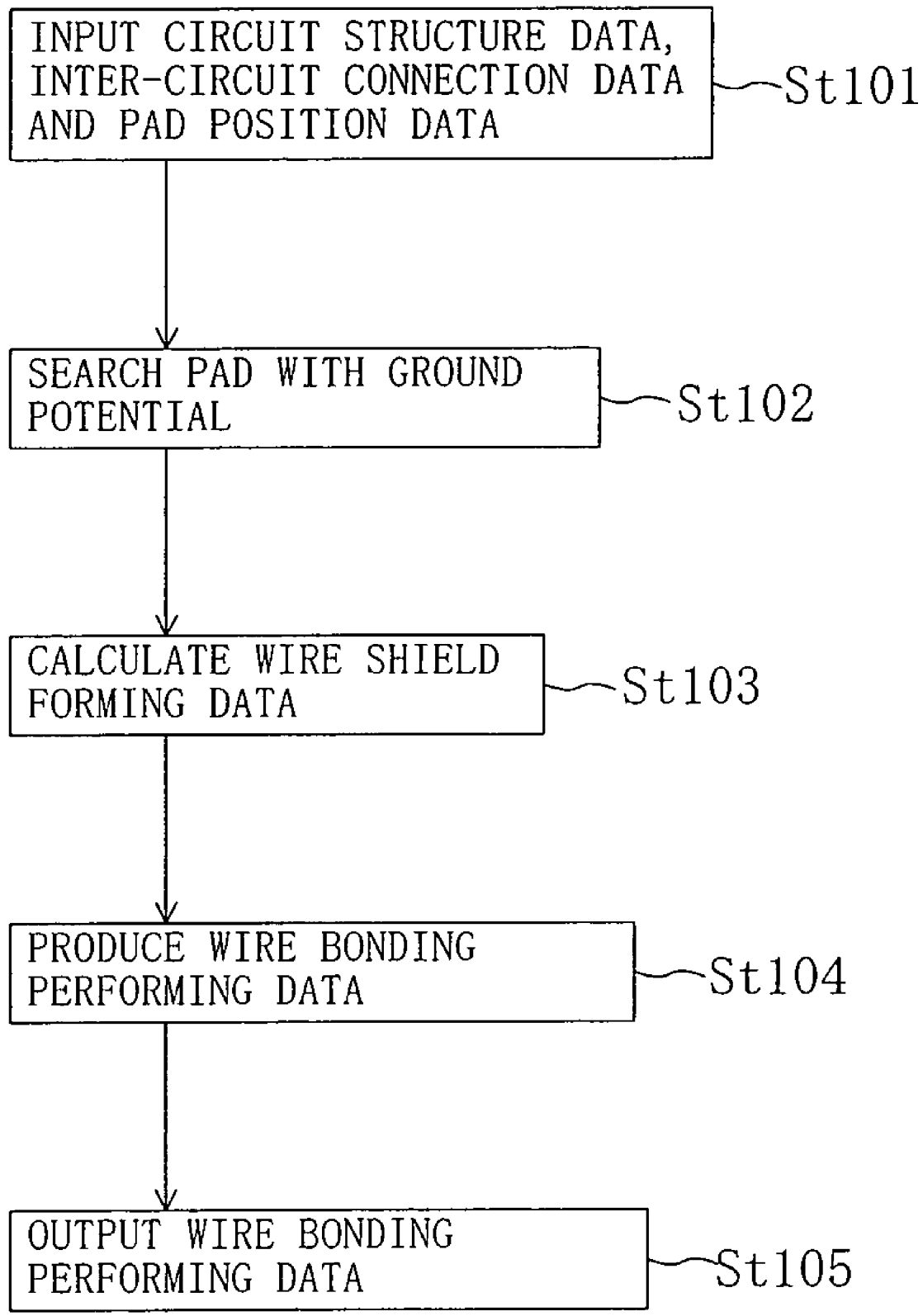
FIG. 26 is a flowchart illustrating operations of the design device in accordance with embodiment 19.
Figure 27:
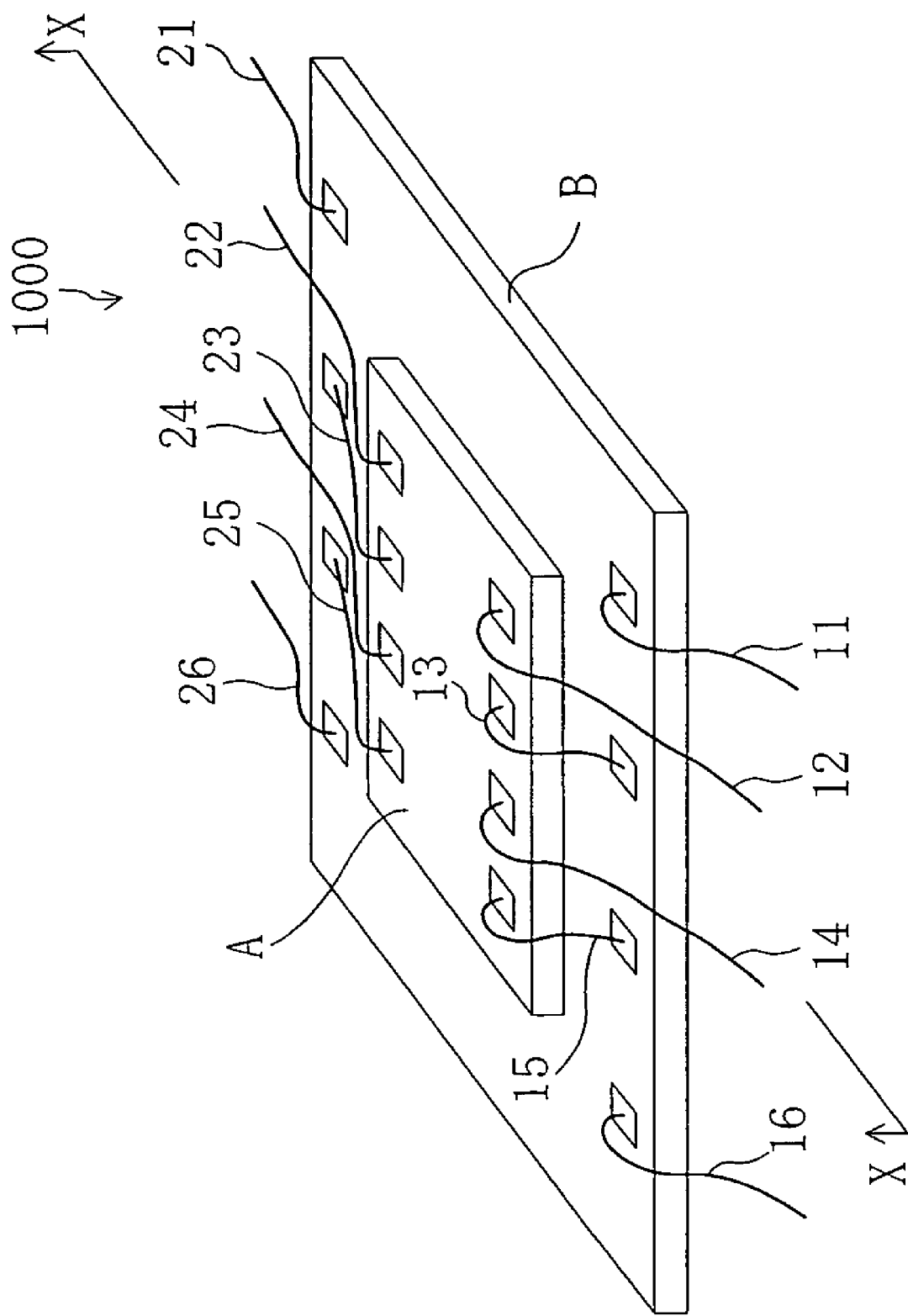
FIG. 27 is a view illustrating the structure of a conventional semiconductor device.
Figure 28:
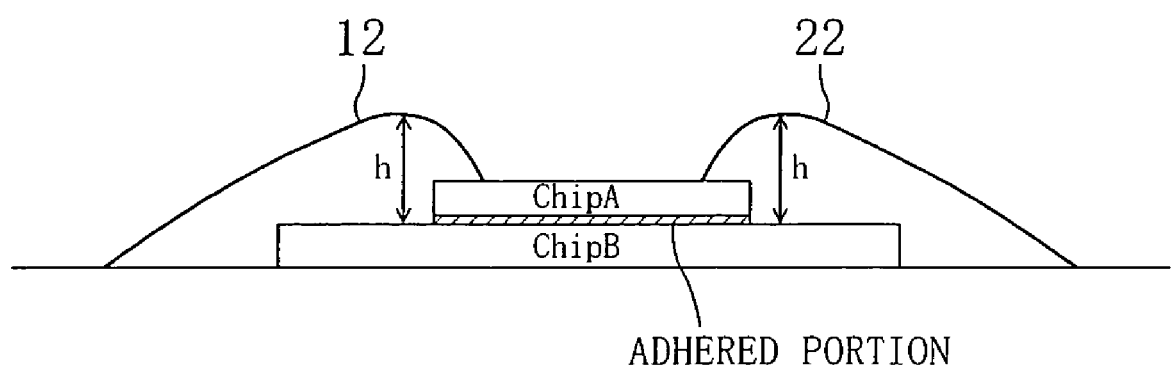
FIG. 28 is a cross-sectional view taken along a line X-X shown in FIG. 27.

This embodiment will describe a method for designing the semiconductor device 500 of the embodiment 8. FIG. 26 is a flowchart illustrating operation of the design device 600 when the semiconductor device 500 of the embodiment 8 is designed.

As shown in FIG. 26, firstly in step St101, circuit structure data, inter-circuit connection data and pad position data are inputted to the input section 71.

Circuit structure data refers to data representing the structures of the internal circuits provided respectively within the semiconductor chips A8 and B8 and the external circuit that the semiconductor device 500 is connected. Inter-circuit connection data refers to data representing the connection relationship between the internal circuit for the semiconductor chip A8, the internal circuit for the semiconductor B8 and the external circuit. Pad position data refers to data representing the positions of the pads 20 for the semiconductor chip A8, the pads 10 for the semiconductor chip B8 and external pads for the external circuit (leads of lead frame).

When the respective data are inputted to the input section 71, the CPU 72 selects the data and stores the same in the database 73.

Next, in step St102, the CPU 72 searches, by using the respective data, pads serving as a ground potential when two semiconductor chips are adhered with each other among the pads for the semiconductor chips A8 and B8.

In step St103, the CPU 72 activates the wire shield forming section 93. The wire shield forming section 93 calculates wire shield forming data for forming a wire shield by connecting the pads serving as a ground potential obtained in step St102.

In step St104, the CPU 72 produces wire bonding performing data for a wire bonding device to perform wire bonding from the wire shield forming data obtained in step St103.

In step St105, the output section 74 outputs the wire bonding performing data.

By the above-described steps being performed, the semiconductor device 500 is designed.

The semiconductor device 500 designed in accordance with this embodiment is provided a shield with a ground potential. For this reason, EMI (Electro Magnetic Interference) can be prevented in the semiconductor device 500.

Other Embodiments

Programs for design methods represented by the flowcharts illustrated in FIGS. 16 to 26 may be recorded in a computer readable recording medium and then be used for designing semiconductor devices with a computer.

Further, the programs for design methods represented by the flowcharts illustrated in FIGS. 16 to 26 may be obtained through electronic information communication means and then be used for designing semiconductor devices with a computer. Specifically, the programs are updated in an FTP site. Then, the programs may be downloaded into a computer via an internet and then be used for designing semiconductor devices.

For example, the steps described in the embodiment 9 (the steps shown in FIG. 16) serving as procedures are stored in a computer readable recording medium as a program. Then, the semiconductor device 100a can be automatically designed.

Examples of the recording medium include, in addition to a magnetic tape utilizing a magnetic body, a floppy (R) disk, an HDD, a non-volatile memory such as an EEPROM and an optical disk such as a CD or a DVD, and any of them may be used.

In accordance with the present invention, a semiconductor device which is easily designed and manufactured and in which a plurality of semiconductor chips are integrally structured can be provided.

What is claimed is:

1. A semiconductor device comprising:
   a first semiconductor chip that includes a plurality of first conductive pads provided on its upper surface;
   a second semiconductor chip that is provided on said first semiconductor chip and includes a plurality of second conductive pads provided on its upper surface; and
   a plurality of first connecting members for connecting said plurality of first conductive pads to said plurality of second conductive pads,
   wherein at least one of said plurality of first connecting members has a resistance value per unit length different from those of the other first connecting members.

2. The semiconductor device of claim 1, wherein at least one of said plurality of first connecting members is made of a material different from those of the other first connecting members.

3. The semiconductor device of claim 1, wherein the number of wires for at least one of said plurality of first connecting members is different from those of the other first connecting members.

* * * * *